United States Patent
Gawase et al.

(10) Patent No.: US 11,502,204 B2
(45) Date of Patent: Nov. 15, 2022

(54) SEMICONDUCTOR DEVICE AND SEMICONDUCTOR MEMORY DEVICE

(71) Applicant: Kioxia Corporation, Tokyo (JP)

(72) Inventors: Akifumi Gawase, Kuwana (JP);
Atsuko Sakata, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/447,330

(22) Filed: Sep. 10, 2021

(65) Prior Publication Data

US 2022/0302320 A1 Sep. 22, 2022

(30) Foreign Application Priority Data

Mar. 17, 2021 (JP) .............................. JP2021-044169

(51) Int. Cl.
*H01L 27/108* (2006.01)
*H01L 29/786* (2006.01)
*H01L 29/66* (2006.01)
*H01L 21/02* (2006.01)
*H01L 29/24* (2006.01)

(52) U.S. Cl.
CPC .. *H01L 29/78693* (2013.01); *H01L 21/02565* (2013.01); *H01L 21/02592* (2013.01); *H01L 27/10805* (2013.01); *H01L 27/10873* (2013.01); *H01L 29/247* (2013.01); *H01L 29/66969* (2013.01); *H01L 29/78642* (2013.01)

(58) Field of Classification Search
CPC ......... H01L 29/78693; H01L 27/10805; H01L 29/247; H01L 29/78642
See application file for complete search history.

(56) References Cited

U.S. PATENT DOCUMENTS

| | | | |
|---|---|---|---|
| 5,627,390 A | * | 5/1997 | Maeda .............. H01L 27/10823 257/302 |
| 7,919,365 B2 | | 4/2011 | Kim et al. |
| 8,063,421 B2 | | 11/2011 | Kang et al. |
| 9,293,600 B2 | | 3/2016 | Nakano et al. |

(Continued)

FOREIGN PATENT DOCUMENTS

| | | |
|---|---|---|
| JP | 2008-219008 A | 9/2008 |
| JP | 2015-065202 A | 4/2015 |

(Continued)

*Primary Examiner* — Eugene Lee
(74) *Attorney, Agent, or Firm* — Oblon, McClelland, Maier & Neustadt, L.L.P.

(57) ABSTRACT

Provided is a semiconductor device of the embodiment including: an oxide semiconductor layer; a gate electrode; a first electrode electrically connected to one portion of the oxide semiconductor layer, the first electrode including a first region, second region, a third region, and a fourth region, the first region disposed between the first portion and the second region, the first region disposed between the third region and the fourth region, the first region containing at least one element of In, Zn, Sn or Cd, and oxygen, the second region containing at least one metal element of Ti, Ta, W, or Ru, the third region and the fourth region containing the at least one metal element and oxygen, the third region and the fourth region having an atomic concentration of oxygen higher than that of the second region; and a second electrode electrically connected to another portion of the oxide semiconductor layer.

20 Claims, 22 Drawing Sheets

(56) References Cited

U.S. PATENT DOCUMENTS

| | | |
|---|---|---|
| 9,780,220 B2 | 10/2017 | Maeda et al. |
| 10,714,629 B2 | 7/2020 | Saito et al. |
| 2019/0296155 A1* | 9/2019 | Sawabe ............ H01L 21/28114 |
| 2020/0013892 A1 | 1/2020 | Kataoka et al. |
| 2021/0305431 A1* | 9/2021 | Ishimaru ........... H01L 27/10855 |
| 2022/0068925 A1* | 3/2022 | Kawai ............... H01L 27/10873 |
| 2022/0085182 A1* | 3/2022 | Kataoka ............ H01L 29/78642 |
| 2022/0085212 A1* | 3/2022 | Sato ........................ H01L 29/24 |

FOREIGN PATENT DOCUMENTS

| | | |
|---|---|---|
| JP | 2015-195277 A | 11/2015 |
| JP | 2019-096856 A | 6/2019 |
| JP | 2019-134077 A | 8/2019 |
| JP | 2020-009911 A | 1/2020 |

\* cited by examiner

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2021-044169, filed on Mar. 17, 2021, the entire contents of which are incorporated herein by reference.

FIELD

Embodiments described herein relate generally to a semiconductor device and a semiconductor memory device.

BACKGROUND

An oxide semiconductor transistor forming a channel in an oxide semiconductor layer has an excellent characteristic that is extremely small channel leakage current during an off operation. Therefore, for example, applying the oxide semiconductor transistor to a switching transistor of a memory cell of a dynamic random access memory (DRAM) has been studied.

For example, in a case where the oxide semiconductor transistor is applied to the switching transistor of the memory cell, the oxide semiconductor transistor undergoes heat treatment accompanying formation of the memory cell and a wiring. Therefore, it is expected to realize an oxide semiconductor transistor having high heat resistance with less variation in characteristics even after the heat treatment.

DETAILED DESCRIPTION

Figure 1:
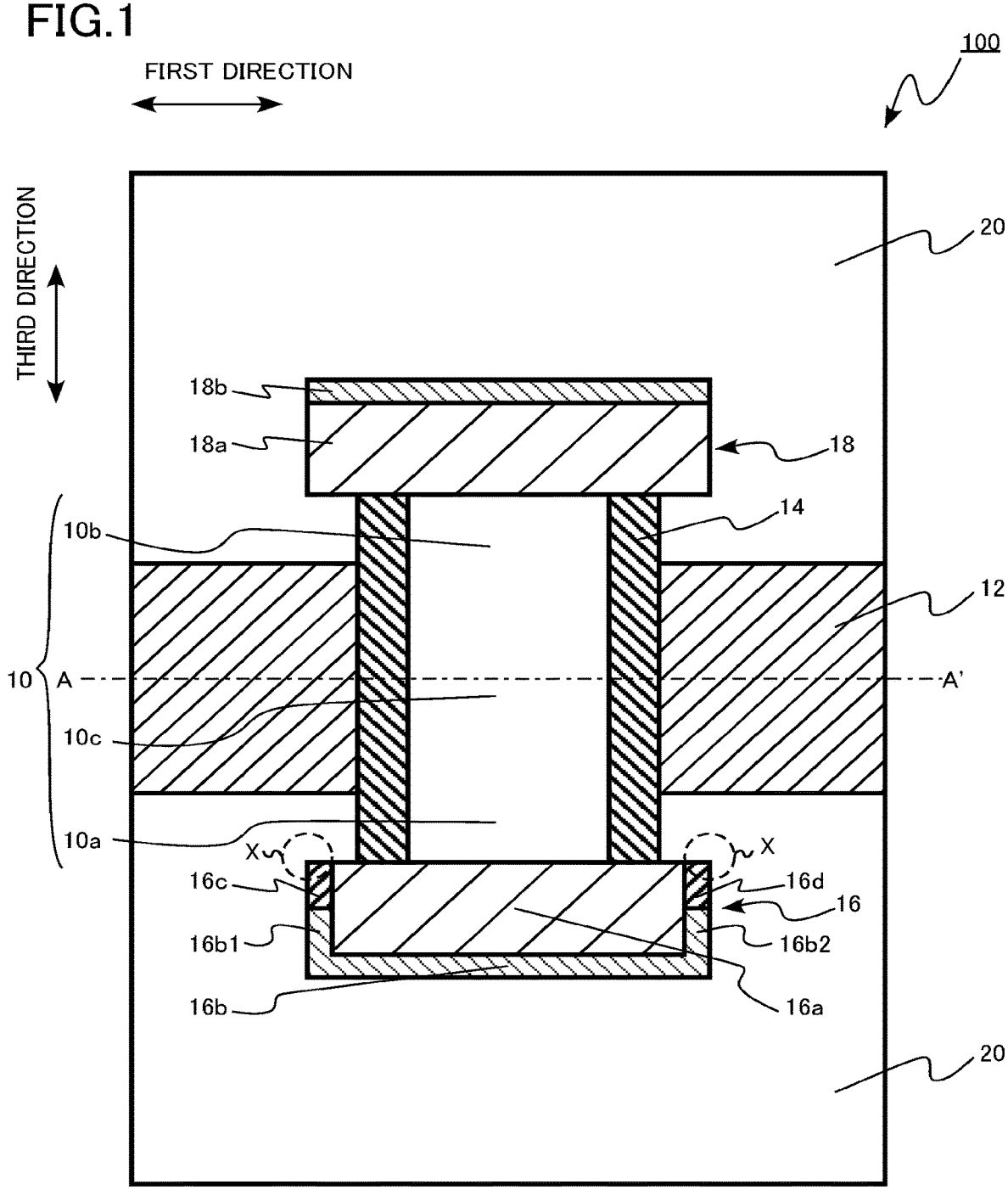
FIG. 1 is a schematic cross-sectional view of a semiconductor device according to a first embodiment.

A semiconductor device according to an embodiment includes: a gate electrode extending in a first direction or a second direction; an oxide semiconductor layer including a first portion, a second portion, and a third portion provided between the first portion and the second portion in a third direction intersecting with the gate electrode; a gate insulating layer provided at least between the third portion and the gate electrode; a first electrode electrically connected to the first portion, the first electrode including a first region, a second region, a third region, and a fourth region, the first region being disposed between the first portion and the second region in the third direction, the first region being disposed between the third region and the fourth region in the first direction, the third region being disposed on an oxide semiconductor layer side of the second region, the fourth region being disposed on the oxide semiconductor layer side of the second region, the first region containing at least one element selected from the group consisting of indium (In), zinc (Zn), tin (Sn) and cadmium (Cd), and oxygen (O), the second region containing at least one metal element selected from the group consisting of titanium (Ti), tantalum (Ta), tungsten (W), and ruthenium (Ru), the third region containing the at least one metal element and oxygen (O), the fourth region containing the at least one metal element and oxygen (O), the third region having an atomic concentration of oxygen (O) higher than an atomic concentration of oxygen (O) of the second region, and the fourth region having an atomic concentration of oxygen (O) higher than the atomic concentration of oxygen (O) of the second region; and a second electrode electrically connected to the second portion, the oxide semiconductor layer provided between the second electrode and the first electrode.

Hereinafter, embodiments of the present disclosure will be described with reference to the drawings. In the following description, the same or similar members are denoted by the same reference numerals, and the description of the members described once is appropriately omitted.

In the present specification, the term "upper" or "lower" may be used for convenience. The "upper" or the "lower" is merely a term indicating a relative positional relationship in the drawings, and is not a term defining a positional relationship with respect to gravity.

Qualitative analysis and quantitative analysis of chemical compositions of members constituting the semiconductor device and the semiconductor memory device in the present specification can be performed by, for example, secondary ion mass spectrometry (SIMS), energy dispersive X-ray spectroscopy (EDX), rutherford back-scattering spectroscopy (RBS), or electron energy-loss spectroscopy (EELS). For example, a transmission electron microscope (TEM) can be used for measuring a thickness of the members constituting the semiconductor device, a distance between the members, a crystal grain size, and the like. Electric resistance of the members constituting the semiconductor device and the semiconductor memory device can be measured by, for example, scanning spreading resistance microscopy (SSRM).

First Embodiment

A semiconductor device according to a first embodiment includes: a gate electrode extending in a first direction or a second direction; an oxide semiconductor layer including a first portion, a second portion, and a third portion provided between the first portion and the second portion in a third direction intersecting with the gate electrode; a gate insulating layer provided at least between the third portion and the gate electrode; a first electrode electrically connected to the first portion, the first electrode including a first region, a second region, a third region, and a fourth region, the first region being disposed between the first portion and the second region in the third direction, the first region being disposed between the third region and the fourth region in the first direction, the third region being disposed on an oxide semiconductor layer side of the second region, the fourth region being disposed on the oxide semiconductor layer side of the second region, the first region containing at least one element selected from the group consisting of indium (In), zinc (Zn), tin (Sn) and cadmium (Cd), and oxygen (O), the second region containing at least one metal element selected from the group consisting of titanium (Ti), tantalum (Ta), tungsten (W), and ruthenium (Ru), the third region containing the at least one metal element and oxygen (O), the fourth region containing the at least one metal element and oxygen (O), the third region having an atomic concentration of oxygen (O) higher than an atomic concentration of oxygen (O) of the second region, and the fourth region having an atomic concentration of oxygen (O) higher than the atomic concentration of oxygen (O) of the second region; and a second electrode electrically connected to the second portion, the oxide semiconductor layer provided between the second electrode and the first electrode.

Figure 2:
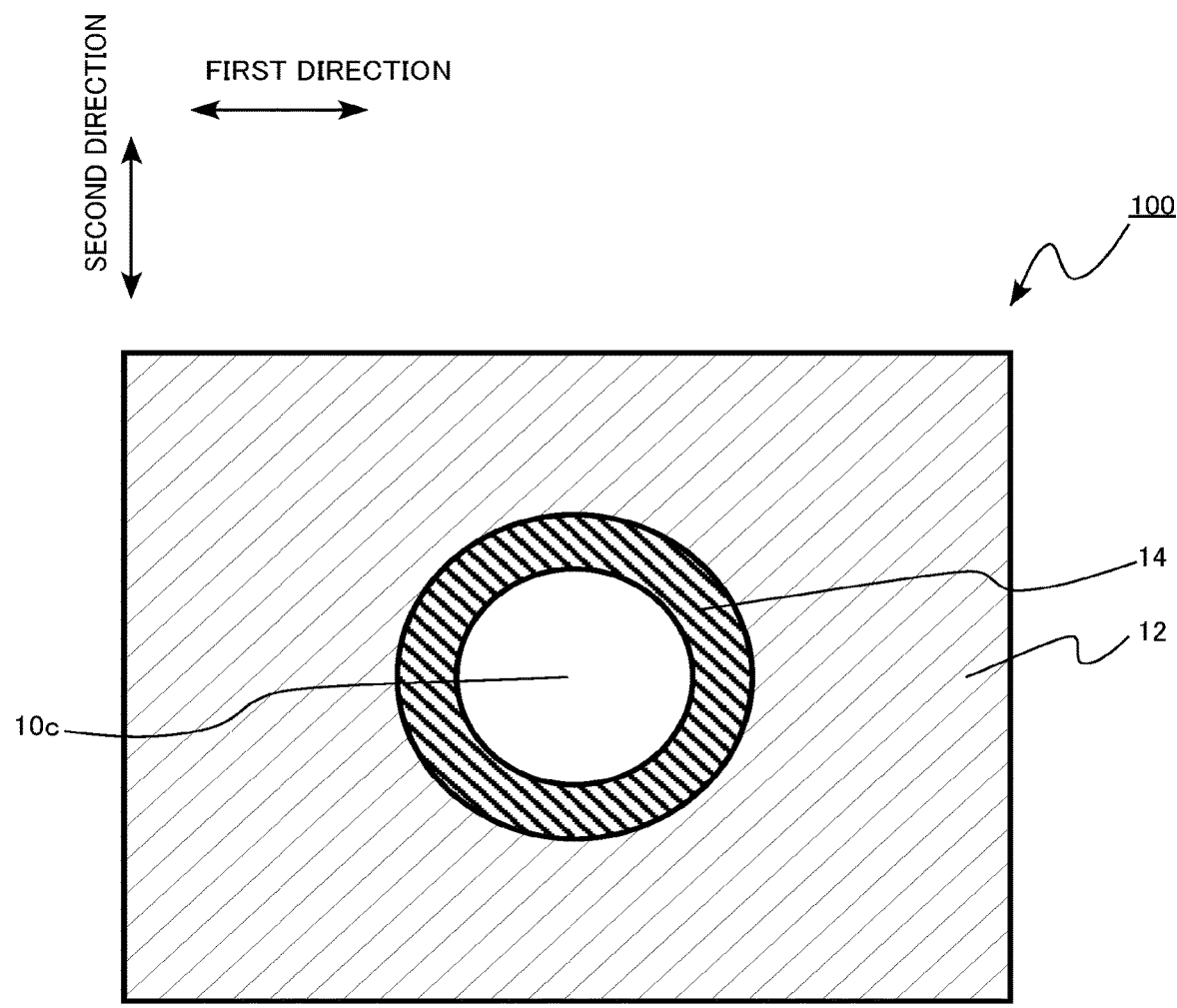
FIG. 2 is a schematic cross-sectional view of the semiconductor device according to the first embodiment.

FIGS. 1 and 2 are schematic cross-sectional views of the semiconductor device according to the first embodiment. FIG. 2 is a cross-sectional view taken along line A-A' of FIG. 1. In FIG. 1, a horizontal direction is referred to as a first direction, a depth direction is referred to as a second direction, and a vertical direction is referred to as a third direction.

The semiconductor device of the first embodiment is a transistor 100. The transistor 100 is an oxide semiconductor transistor in which a channel is formed in an oxide semiconductor. The transistor 100 is a so-called surrounding gate transistor (SGT) in which a gate electrode is provided to surround an oxide semiconductor layer in which a channel is formed. The transistor 100 is a so-called vertical transistor. The transistor 100 is an re-channel transistor using electrons as a carrier.

The transistor 100 includes an oxide semiconductor layer 10, a gate electrode 12, a gate insulating layer 14, a lower electrode 16, an upper electrode 18, and an interlayer insulating layer 20. The lower electrode 16 is an example of a first electrode. The upper electrode 18 is an example of a second electrode.

The oxide semiconductor layer 10 is provided between the lower electrode 16 and the upper electrode 18. In the oxide semiconductor layer 10, a channel serving as a current path is formed when the transistor 100 is turned on. The oxide semiconductor layer 10 extends in the third direction. The oxide semiconductor layer 10 has a columnar shape extending in the third direction. The oxide semiconductor layer 10 has, for example, a cylindrical shape.

A direction in which electrons flow in the channel is referred to as a channel length direction. The third direction is the channel length direction of the transistor 100.

The oxide semiconductor layer 10 is an oxide semiconductor. The oxide semiconductor layer 10 is a metal oxide. The oxide semiconductor layer 10 is, for example, amorphous.

The oxide semiconductor layer 10 contains, for example, indium (In), gallium (Ga), and zinc (Zn). A ratio of a sum of atomic concentrations of indium, gallium, and zinc to a sum of atomic concentrations of metal elements contained in the oxide semiconductor layer 10 is, for example, equal to or more than 90%. The ratio of the sum of the atomic concentrations of indium, gallium, and zinc to a sum of atomic concentrations of elements other than oxygen contained in the oxide semiconductor layer 10 is, for example, equal to or more than 90%. For example, in the oxide semiconductor layer 10, there is no element other than oxygen, which has an atomic concentration higher than any one of indium, gallium, and zinc.

The oxide semiconductor layer 10 includes a first portion 10a, a second portion 10b, and a third portion 10c. The third portion 10c is a portion between the first portion 10a and the second portion 10b. The third portion 10c provided between the first portion 10a and the second portion 10c in the third direction.

The oxide semiconductor layer 10 includes, for example, an oxygen deficiency. The oxygen deficiency in the oxide semiconductor layer 10 functions as a donor.

A width of the oxide semiconductor layer 10 in the first direction is, for example, equal to or more than 20 nm and equal to or less than 100 nm. A length of the oxide semiconductor layer 10 in the third direction is, for example, equal to or more than 80 nm and equal to or less than 200 nm.

The gate electrode 12 is provided to surround the oxide semiconductor layer 10. The gate electrode 12 is provided around the oxide semiconductor layer 10. The gate electrode 12 extends in a direction intersecting with the oxide semiconductor layer 10. The gate electrode 12 extends, for example, in the first direction or the second direction.

The gate electrode 12 is formed of, for example, metal, a metal compound, or a semiconductor. The gate electrode 12 is formed of, for example, titanium nitride (TiN) or tungsten (W). A gate length of the gate electrode 12 is, for example, equal to or more than 20 nm and equal to or less than 100 nm. The gate length of the gate electrode 12 is a length of the gate electrode 12 in the third direction.

The gate insulating layer 14 is provided between the oxide semiconductor layer 10 and the gate electrode 12. The gate insulating layer 14 is provided to surround the oxide semiconductor layer 10. The gate insulating layer 14 is provided between the third portion 10c and the gate electrode 12.

The gate insulating layer 14 is formed of, for example, an oxide or an oxynitride. The gate insulating layer 14 is formed of, for example, silicon oxide or aluminum oxide. A thickness of the gate insulating layer 14 is, for example, equal to or more than 2 nm and equal to or less than 10 nm.

An oxide layer (not illustrated) formed of a material different from that of the gate insulating layer 14 can be provided between the oxide semiconductor layer 10 and the gate insulating layer 14.

The lower electrode 16 is provided on a lower side of the oxide semiconductor layer 10. The lower electrode 16 is provided on a lower side of the first portion 10a. The lower electrode 16 is electrically connected to the first portion 10a of the oxide semiconductor layer 10. The lower electrode 16 includes a first region 16a, a second region 16b, a third region 16c, and a fourth region 16d.

The first region 16a is disposed between the first portion 10a of the oxide semiconductor layer 10 and the second region 16b. The first region 16a is disposed in the third direction of the second region 16b.

The first region 16a is disposed between the third region 16c and the fourth region 16d. The first region 16a is disposed in the first direction of the third region 16c and the fourth region 16d.

The first region 16a is disposed between one part 16b1 of the second region 16b and another part 16b2 of the second region 16b. The first region 16a is disposed between one part 16b1 of the second region 16b and the other part 16b2 of the second region 16b in the first direction.

The third region 16c is disposed on the oxide semiconductor layer 10 side of the second region 16b. The third region 16c is disposed in the third direction of the second region 16b. The third region 16c is disposed on the oxide semiconductor layer 10 side of one part 16b1 of the second region 16b. The third region 16c is disposed in the third direction of one part 16b1 of the second region 16b.

The fourth region 16d is disposed on the oxide semiconductor layer 10 side of the second region 16b. The fourth region 16d is disposed on the oxide semiconductor layer 10 side of the second region 16b. The fourth region 16d is disposed on the oxide semiconductor layer 10 side of the other part 16b2 of the second region 16b. The fourth region 16d is disposed in the third direction of the other part 16b2 of the second region 16b.

The first region 16a contains at least one element selected from the group consisting of indium (In), zinc (Zn), tin (Sn) and cadmium (Cd), and oxygen (O). Among the atomic concentrations of the elements other than oxygen (O) contained in the first region 16a, the atomic concentration of the at least one element described above is the highest. The first region 16a is formed of a metal oxide having conductivity.

The first region 16a contains, for example, indium (In) and tin (Sn). The first region 16a is formed of, for example, an oxide containing indium (In) and tin (Sn).

A thickness of the first region 16a is, for example, equal to or more than 10 nm and equal to or less than 30 nm. The thickness of the first region 16a is a thickness in the third direction.

The second region 16b contains at least one metal element selected from the group consisting of titanium (Ti), tantalum (Ta), tungsten (W), and ruthenium (Ru). Among the atomic concentrations of the metal elements contained in the second region 16b, the atomic concentration of the at least one metal element described above is the highest. Among the atomic concentrations of the elements other than nitrogen (N) contained in the second region 16b, the atomic concentration of the at least one metal element described above is the highest.

The second region 16b contains, for example, nitrogen (N). The second region 16b may or may not contain oxygen (O). An atomic concentration of oxygen in the second region 16b is lower than the atomic concentration of oxygen of the first region 16a.

The second region 16b is a conductor. The second region 16b is formed of, for example, a metal or a metal nitride.

The second region 16b is formed of, for example, titanium, titanium nitride, tantalum, tantalum nitride, or tungsten nitride.

A thickness of the second region 16b is smaller than the thickness of the first region 16a. The thickness of the second region 16b is, for example, equal to or more than 2 nm and equal to or less than 10 nm. The thickness of the second region 16b is a thickness in the third direction.

The third region 16c contains at least one metal element selected from the group consisting of titanium (Ti), tantalum (Ta), tungsten (W) and ruthenium (Ru), and oxygen (O). The third region 16c contains the same metal element as that of the second region 16b. Among the atomic concentrations of the metal elements contained in the third region 16c, the atomic concentration of the at least one metal element described above is the highest. Among the atomic concentrations of the elements other than oxygen (O) and nitrogen (N) contained in the third region 16c, the atomic concentration of the at least one metal element described above is the highest.

The third region 16c contains, for example, nitrogen (N).

The third region 16c is, for example, an insulator. The third region 16c is formed of, for example, a metal oxide or a metal oxynitride.

The third region 16c is formed of, for example, titanium oxide, titanium oxynitride, tantalum oxide, tantalum oxynitride, or tungsten oxynitride.

An atomic concentration of oxygen (O) of the third region 16c is higher than the atomic concentration of oxygen (O) of the second region 16b. The atomic concentration of oxygen (O) of the third region 16c is, for example, two or more orders of magnitude higher than the atomic concentration of oxygen (O) of the second region 16b. The atomic concentration of oxygen (O) of the third region 16c is, for example, equal to or more than $1 \times 10^{20}$ atoms/cm$^3$.

For example, the electric resistance of the third region 16c is higher than the electric resistance of the second region 16b.

The fourth region 16d contains at least one metal element selected from the group consisting of titanium (Ti), tantalum (Ta), tungsten (W) and ruthenium (Ru), and oxygen (O). The fourth region 16d contains the same metal element as that of the second region 16b. Among the atomic concentrations of the metal elements contained in the fourth region 16d, the atomic concentration of the at least one metal element described above is the highest. Among the atomic concentrations of the elements other than oxygen (O) and nitrogen (N) contained in the fourth region 16d, the atomic concentration of the at least one metal element described above is the highest.

The fourth region 16d contains, for example, nitrogen (N).

The fourth region 16d is, for example, an insulator. The fourth region 16d is formed of, for example, a metal oxide or a metal oxynitride.

The fourth region 16d is formed of, for example, titanium oxide, titanium oxynitride, tantalum oxide, tantalum oxynitride, or tungsten oxynitride.

An atomic concentration of oxygen (O) of the fourth region 16d is higher than the atomic concentration of oxygen (O) of the second region 16b. The atomic concentration of oxygen (O) of the fourth region 16d is, for example, two or more orders of magnitude higher than the atomic concentration of oxygen (O) of the second region 16b. The atomic concentration of oxygen (O) of the fourth region 16d is, for example, equal to or more than $1 \times 10^{20}$ atoms/cm$^3$.

For example, the electric resistance of the fourth region 16d is higher than the electric resistance of the second region 16b.

The upper electrode 18 is provided on an upper side of the oxide semiconductor layer 10. The upper electrode 18 is provided on an upper side of the second portion 10b. The upper electrode 18 is electrically connected to the second portion 10b.

The upper electrode 18 includes a fifth region 18a and a sixth region 18b. The fifth region 18a is disposed between the second portion 10b and the sixth region 18b. The fifth region 18a is disposed in the third direction of the sixth region 18b.

The fifth region 18a contains at least one element selected from the group consisting of indium (In), zinc (Zn), tin (Sn) and cadmium (Cd), and oxygen (O). The fifth region 18a is formed of a metal oxide having conductivity.

The fifth region 18a contains, for example, indium (In) and tin (Sn). The fifth region 18a is formed of, for example, an oxide containing indium (In) and tin (Sn).

A thickness of the fifth region 18a is, for example, equal to or more than 10 nm and equal to or less than 30 nm. The thickness of the fifth region 18a is a thickness in the third direction.

The sixth region 18b contains, for example, at least one metal element selected from the group consisting of titanium (Ti), tantalum (Ta), tungsten (W), and ruthenium (Ru). Among the atomic concentrations of the metal elements contained in the sixth region 18b, for example, the atomic concentration of the at least one metal element described above is the highest. The sixth region 18b contains, for example, the same metal element as that of the second region 16b, the third region 16c, and the fourth region 16d.

The sixth region 18b contains, for example, nitrogen (N). The sixth region 18b may or may not contain oxygen (O).

The sixth region 18b is a conductor. The sixth region 18b is formed of, for example, a metal or a metal nitride.

The second region 16b is formed of, for example, titanium, titanium nitride, tantalum, tantalum nitride, or tungsten nitride.

A thickness of the sixth region 18b is smaller than the thickness of the fifth region 18a. The thickness of the sixth region 18b is, for example, equal to or more than 2 nm and equal to or less than 10 nm. The thickness of the sixth region 18b is a thickness in the third direction.

The atomic concentration of oxygen (O) of the sixth region 18b is, for example, lower than the atomic concentration of oxygen (O) of the third region 16c. The atomic concentration of oxygen (O) of the sixth region 18b is, for example, lower than the atomic concentration of oxygen (O) of the fourth region 16d.

The interlayer insulating layer 20 is provided around the gate electrode 12, the gate insulating layer 14, the lower electrode 16, and the upper electrode 18. The interlayer insulating layer 20 is formed of, for example, an oxide, a nitride, or an oxynitride. The interlayer insulating layer 20 is formed of, for example, silicon oxide, silicon nitride, or silicon oxynitride.

Next, an example of a method for manufacturing the semiconductor device according to the first embodiment will be described. FIGS. 3, 4, 5, 6, 7, 8, 9, 10, 11, 12, and 13 are explanatory diagrams of the method for manufacturing the semiconductor device according to the first embodiment.

Figure 3:
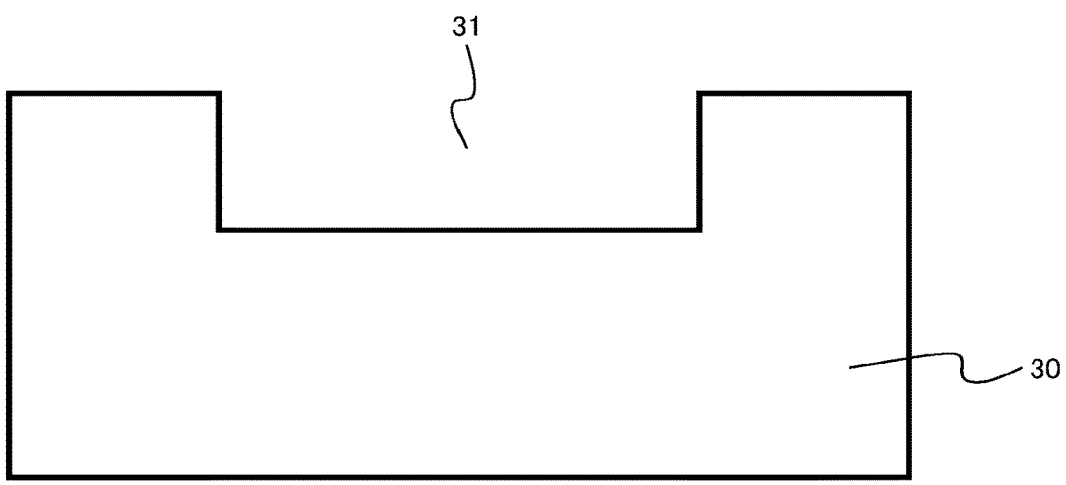
FIG. 3 is an explanatory diagram of a method for manufacturing a semiconductor device according to the first embodiment.

First, a groove 31 is formed in an insulating layer (FIG. 3). The groove 31 is formed by using, for example, a photolithography method and a reactive ion etching method (RIE method). The insulating layer 30 is, for example, a silicon oxide layer. The insulating layer 30 finally becomes a part of the interlayer insulating layer 20.

Figure 4:
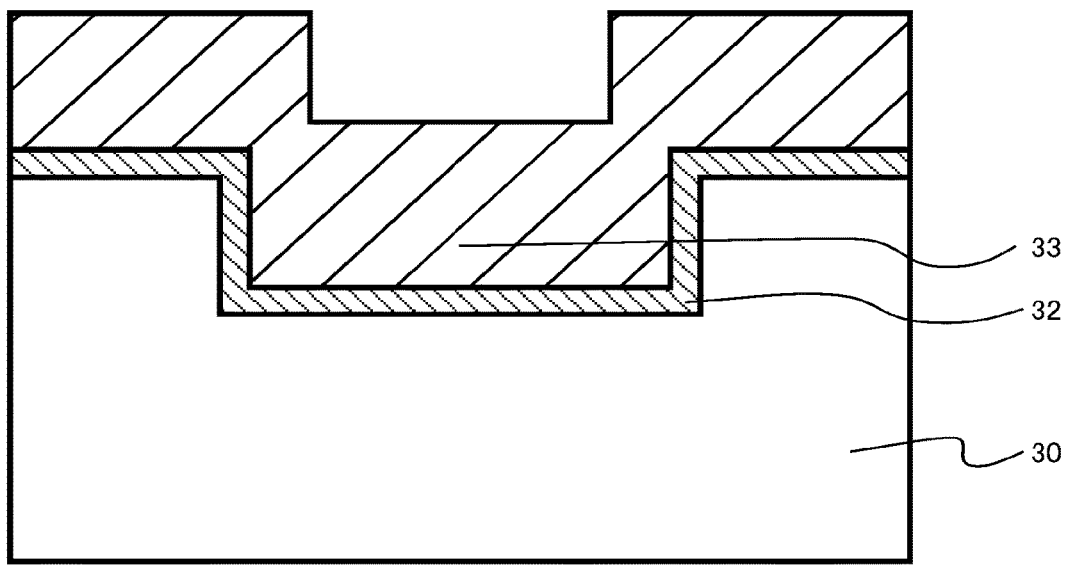
FIG. 4 is an explanatory diagram of the method for manufacturing a semiconductor device according to the first embodiment.

Next, the groove 31 is filled with a first conductive film 32 and a first metal oxide film 33 (FIG. 4). The first conductive film 32 is, for example, a titanium nitride film formed by a sputtering method. The first metal oxide film 33 is, for example, an indium tin oxide film formed by the sputtering method.

The first conductive film 32 finally becomes the second region 16b, the third region 16c, and the fourth region 16d. The first metal oxide film 33 finally becomes the first region 16a.

Figure 5:
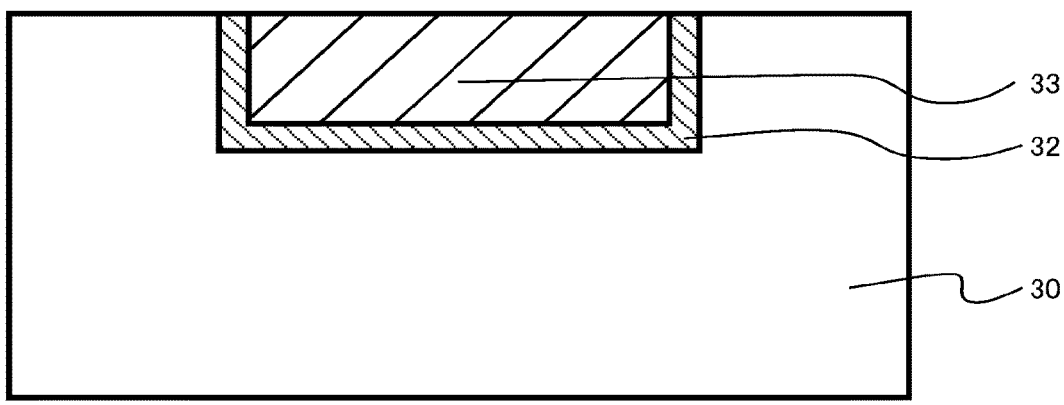
FIG. 5 is an explanatory diagram of the method for manufacturing a semiconductor device according to the first embodiment.

Next, the first conductive film 32 and the first metal oxide film 33 on the insulating layer 30 are removed (FIG. 5). The first conductive film 32 and the first metal oxide film 33 are removed by using a chemical mechanical polishing method (CMP method).

Figure 6:
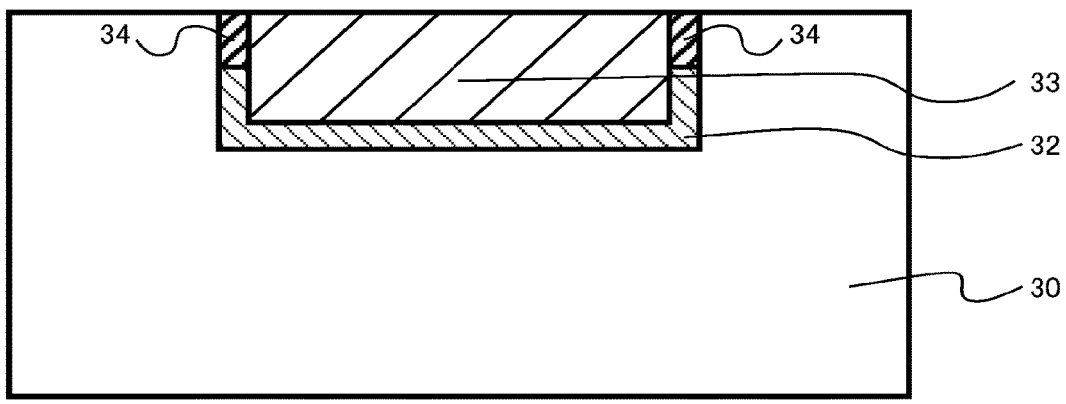
FIG. 6 is an explanatory diagram of the method for manufacturing a semiconductor device according to the first embodiment.

Next, an upper portion of the first conductive film 32 exposed on a surface of the insulating layer 30 is oxidized (FIG. 6). An oxide film 34 is formed by oxidizing the upper portion of the first conductive film 32. The oxide film 34 is, for example, a titanium oxide film. The oxide film 34 finally becomes the third region 16c and the fourth region 16d.

A method for oxidizing the upper portion of the first conductive film 32 is not particularly limited. However, the method is required to be a method capable of sufficiently oxidizing the upper portion of the first conductive film 32, such as a heat treatment in an oxygen atmosphere and an oxygen plasma treatment.

Figure 7:
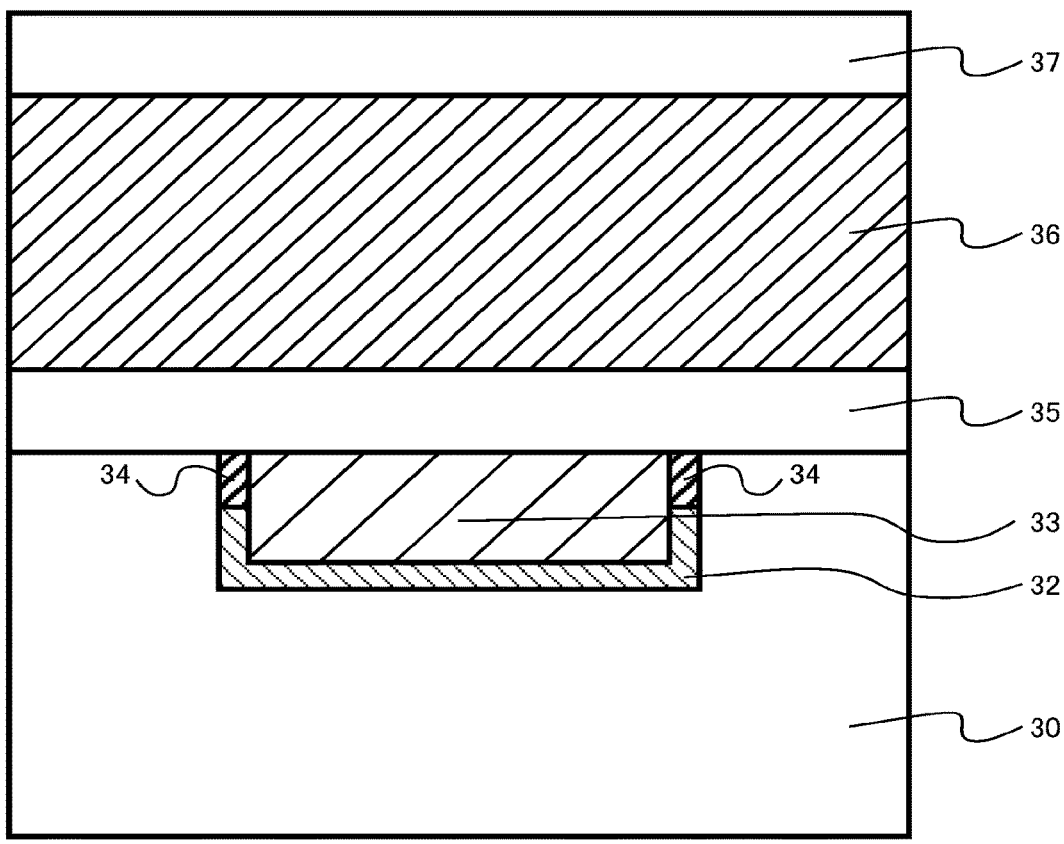
FIG. 7 is an explanatory diagram of the method for manufacturing a semiconductor device according to the first embodiment.

Next, a first insulating film 35, a conductive layer 36, and a second insulating film 37 are formed on the insulating layer 30 and the first metal oxide film 33 (FIG. 7). The first insulating film 35 is, for example, a silicon oxide film formed by a chemical vapor deposition method (CVD method). The conductive layer 36 is, for example, a tungsten layer formed by the CVD method. The second insulating film 37 is, for example, a silicon oxide film formed by the CVD method.

The first insulating film 35 and the second insulating film 37 finally become a part of the interlayer insulating layer 20. The conductive layer 36 finally becomes the gate electrode 12.

Figure 8:
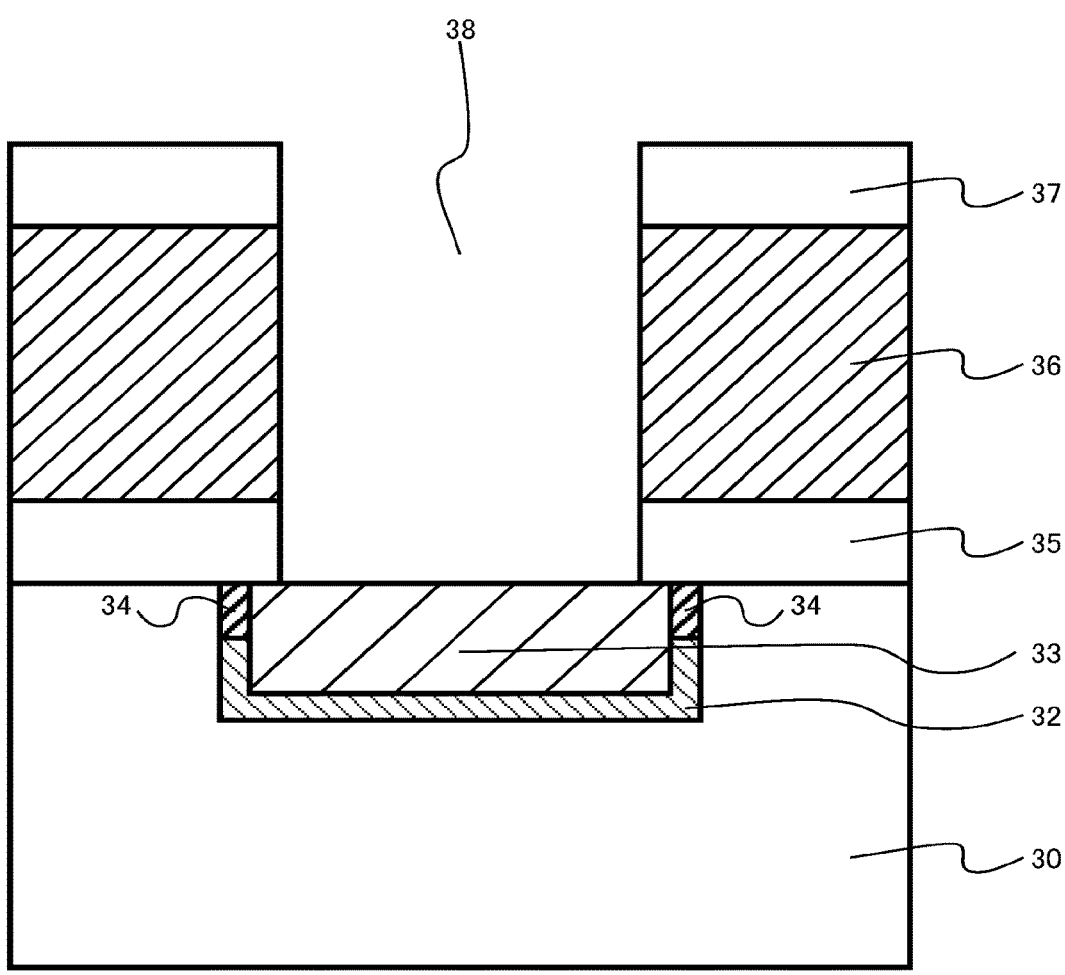
FIG. 8 is an explanatory diagram of the method for manufacturing a semiconductor device according to the first embodiment.

Next, an opening 38 is formed in the second insulating film 37, the conductive layer 36, and the first insulating film 35 (FIG. 8). The opening 38 is formed by, for example, the photolithography method and the RIE method.

Figure 9:
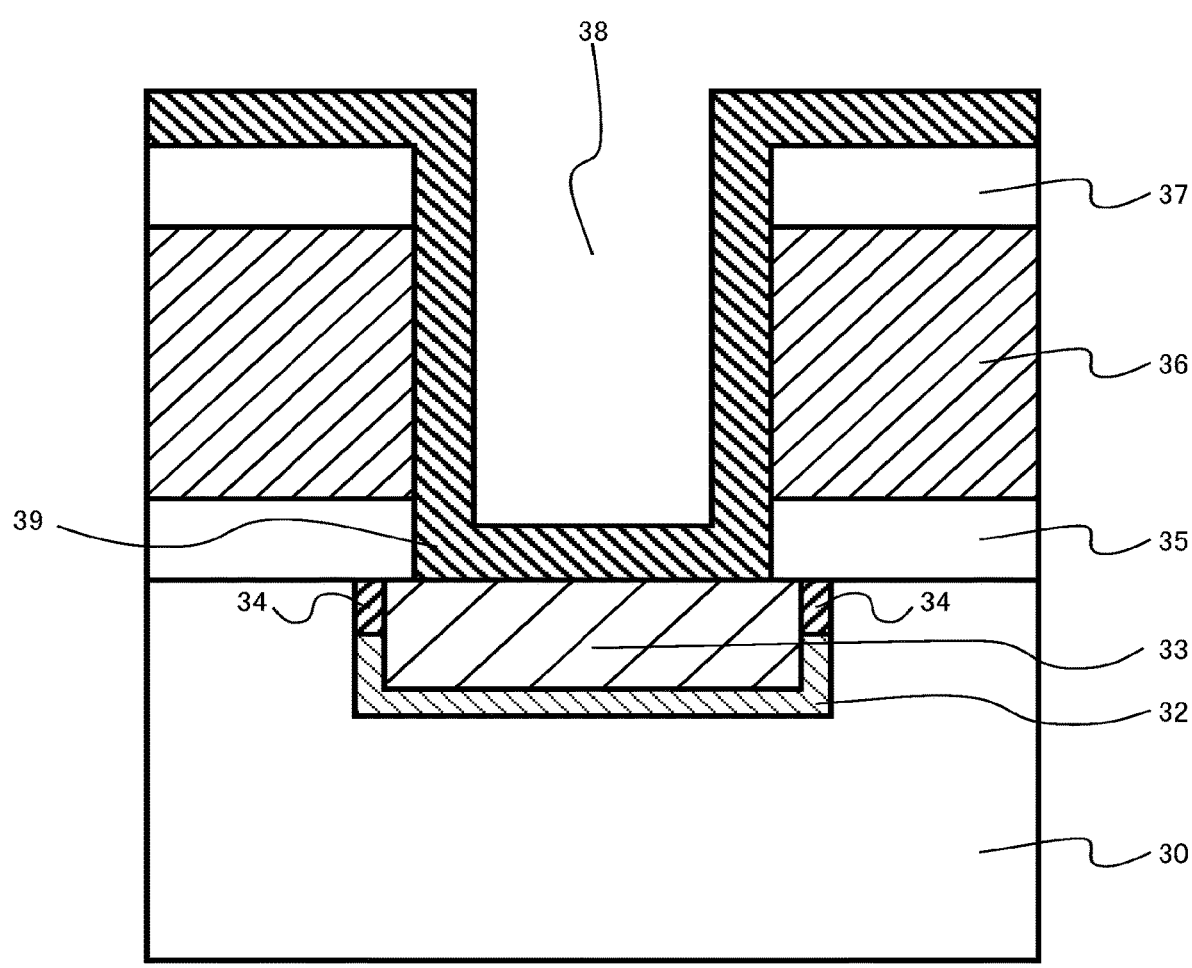
FIG. 9 is an explanatory diagram of the method for manufacturing a semiconductor device according to the first embodiment.

Next, a third insulating film 39 is formed in the opening 38 (FIG. 9). The third insulating film 39 is, for example, a silicon oxide film formed by the CVD method. The third insulating film 39 finally becomes the gate insulating layer 14.

Figure 10:
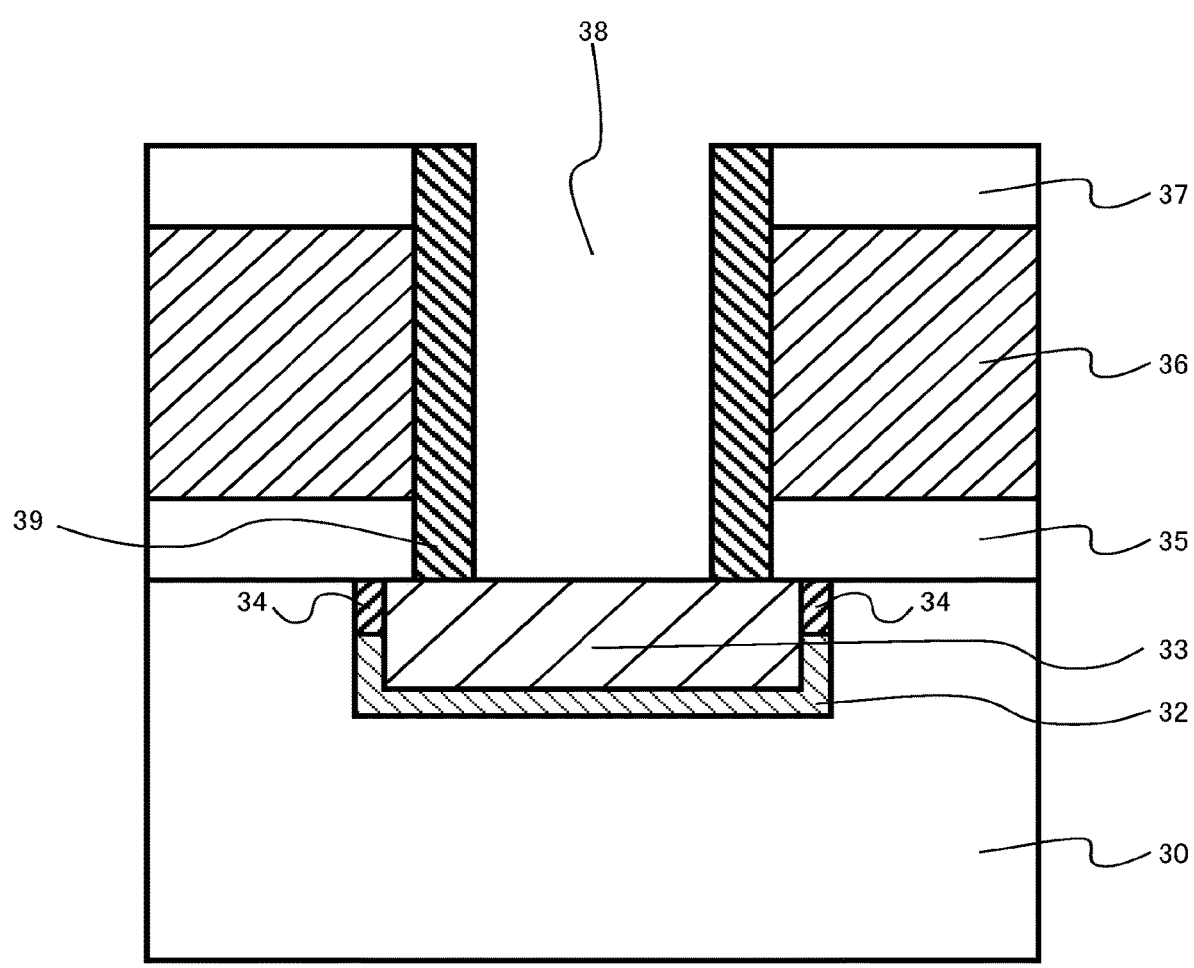
FIG. 10 is an explanatory diagram of the method for manufacturing a semiconductor device according to the first embodiment.

Next, a bottom portion of the opening 38 and the third insulating film 39 on a surface of the second insulating film 37 are removed (FIG. 10). The third insulating film 39 is removed by using, for example, the RIE method.

Figure 11:
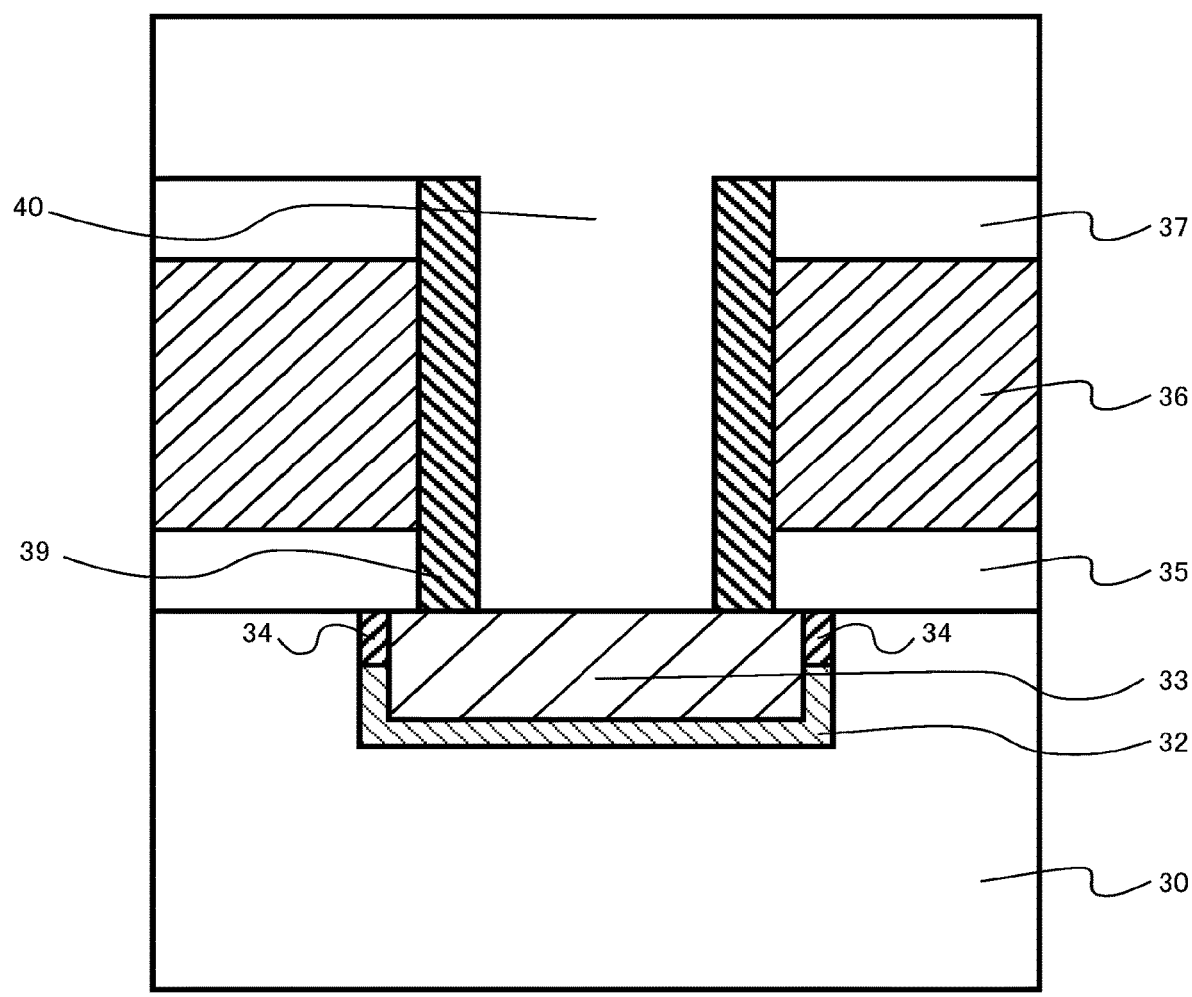
FIG. 11 is an explanatory diagram of the method for manufacturing a semiconductor device according to the first embodiment.

Next, an oxide semiconductor film 40 is formed in the opening 38 (FIG. 11). The oxide semiconductor film 40 contains, for example, indium (In), gallium (Ga), and zinc (Zn). The oxide semiconductor film 40 is formed by using, for example, the CVD method. The oxide semiconductor film 40 finally becomes the oxide semiconductor layer 10.

Figure 12:
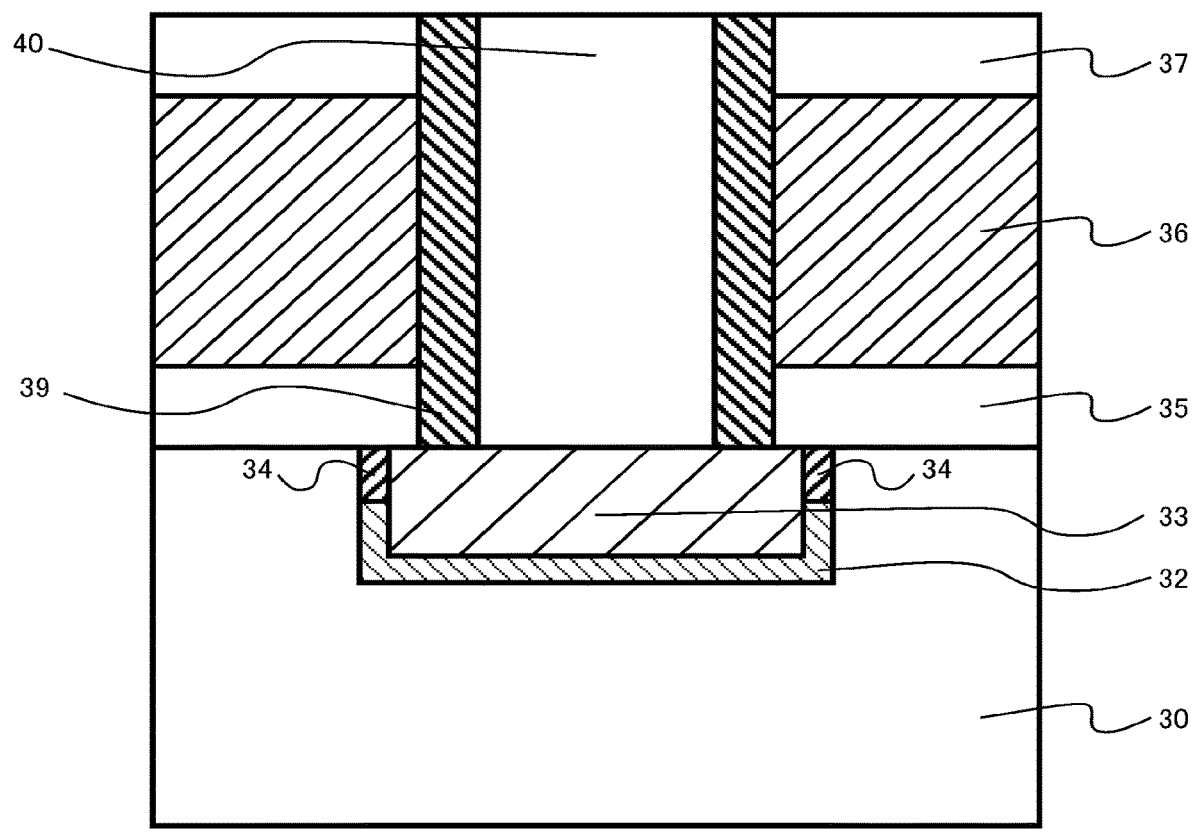
FIG. 12 is an explanatory diagram of the method for manufacturing a semiconductor device according to the first embodiment.

Next, the oxide semiconductor film 40 on the surface of the second insulating film 37 is removed (FIG. 12). The oxide semiconductor film 40 is removed by using, for example, the CMP method.

Next, a second metal oxide film 41 and a second conductive film 42 are formed on the surfaces of the second insulating film 37 and the oxide semiconductor film 40. The second metal oxide film 41 is, for example, an indium tin oxide film formed by the sputtering method. The second conductive film 42 is, for example, a titanium nitride film formed by a sputtering method.

The second metal oxide film 41 finally becomes the fifth region 18a. The second conductive film 42 finally becomes the sixth region 18b.

Figure 13:
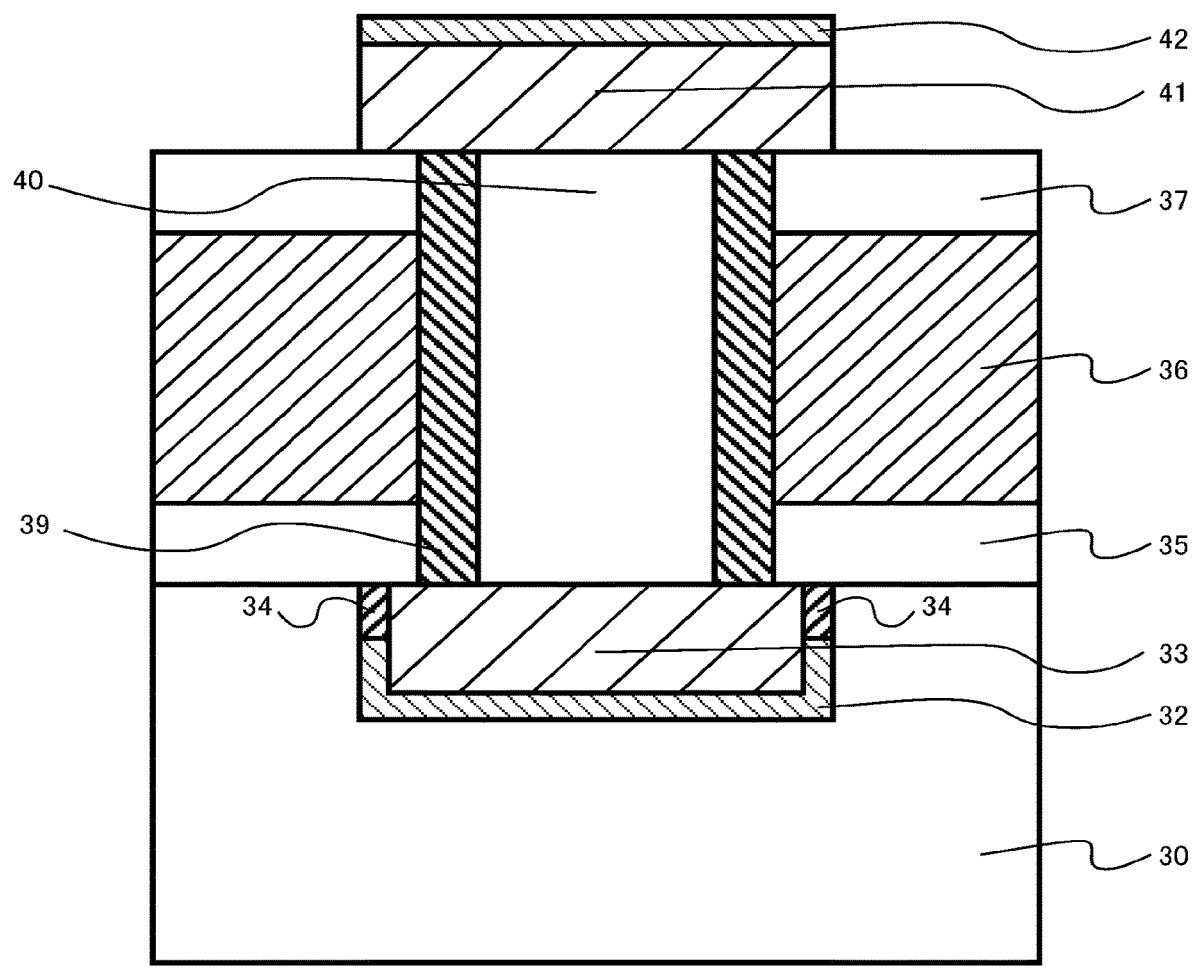
FIG. 13 is an explanatory diagram of the method for manufacturing a semiconductor device according to the first embodiment.

Next, the second metal oxide film 41 and the second conductive film 42 are patterned (FIG. 13). The second metal oxide film 41 and the second conductive film 42 are patterned by using, for example, the photolithography method and the RIE method.

After that, an insulating film is formed on the second metal oxide film 41 and the second conductive film 42.

The transistor 100 of the first embodiment is formed by the manufacturing method described above.

Hereinafter, a function and an effect of the semiconductor device according to the first embodiment will be described.

When the lower electrode 16 of the transistor 100 is formed, the groove 31 formed in the insulating layer 30 is filled with the first metal oxide film 33, and then the first metal oxide film 33 is planarized by the CMP method. The first metal oxide film 33 becomes the first region 16a of the lower electrode 16. When the groove 31 is filled with the first metal oxide film 33, adhesion to the insulating layer 30 becomes low, for example, there is a possibility that film peeling occurs when the first metal oxide film 33 is removed by the CMP method.

In the lower electrode 16 of the transistor 100, the second region 16b is provided between the first region 16a and the interlayer insulating layer 20. At the time of manufacturing the transistor 100, as illustrated in FIG. 4, the first conductive film 32 serving as the second region 16b is formed before the first metal oxide film 33 is formed. The first conductive film 32 has high adhesion to the insulating layer 30. Therefore, the film peeling when the first metal oxide film 33 is removed by the CMP method is suppressed. According to this, the manufacturing yield of the transistor 100 is improved.

For example, in a case where the oxide semiconductor transistor is applied to the switching transistor of the memory cell, the oxide semiconductor transistor undergoes heat treatment accompanying formation of the memory cell and a wiring. A threshold voltage of the oxide semiconductor transistor may fluctuate due to the heat treatment.

The fluctuation of the threshold voltage of the oxide semiconductor transistor occurs when oxygen in the oxide semiconductor layer in which the channel is formed is released to the lower electrode or the upper electrode at the time of the heat treatment. When oxygen in the oxide semiconductor layer is released, oxygen deficiency occurs in the oxide semiconductor layer.

The oxygen deficiency functions as a donor in the oxide semiconductor layer. Therefore, for example, in a case where the oxide semiconductor transistor is an re-channel transistor, when the oxygen deficiency occurs, the threshold voltage of the oxide semiconductor transistor decreases.

Figure 14:
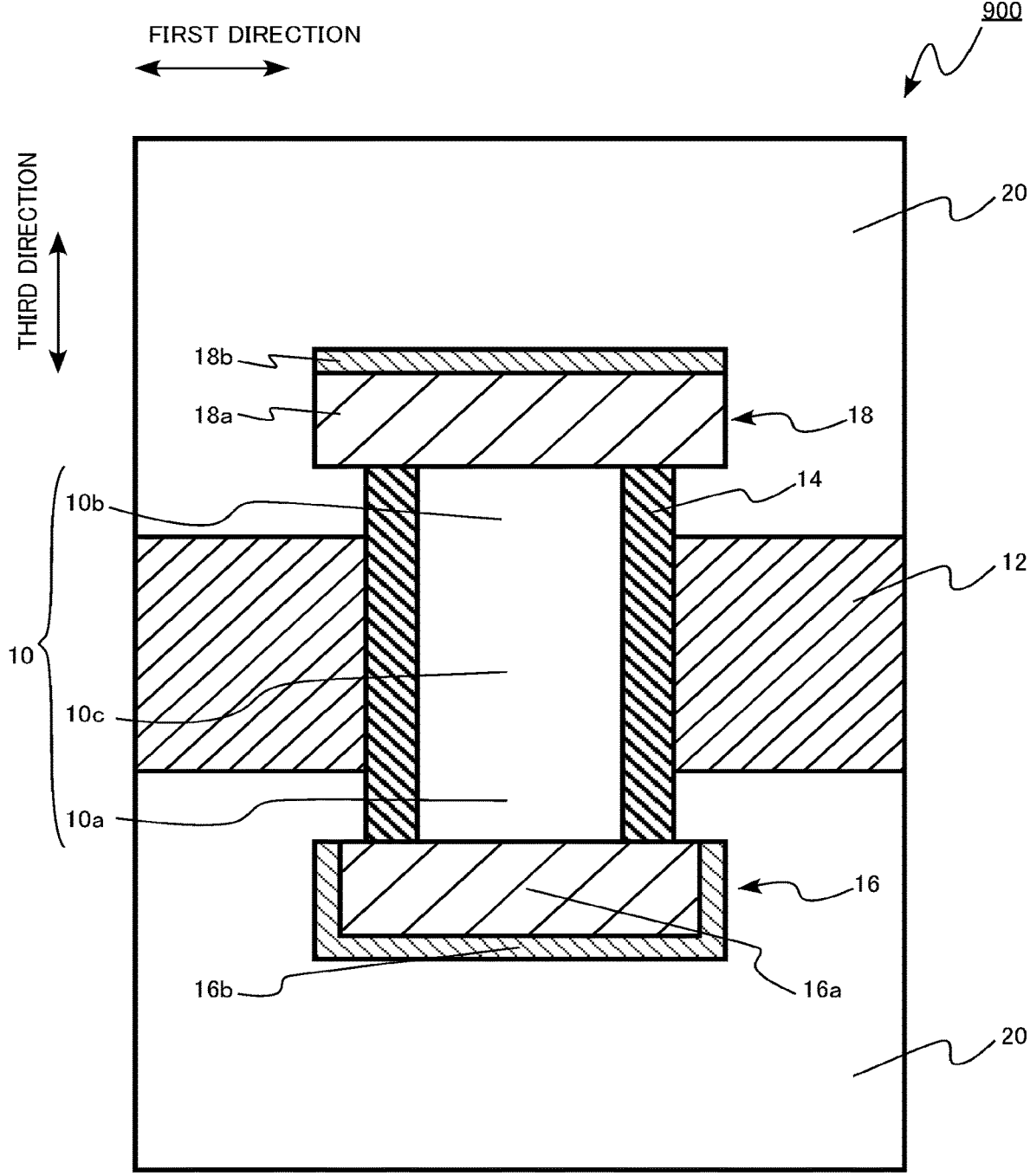
FIG. 14 is a schematic cross-sectional view of a semiconductor device according to a comparative example.

FIG. 14 is a schematic cross-sectional view of a semiconductor device according to a comparative example. The semiconductor device of the comparative example is a transistor 900.

The transistor 900 of the comparative example is different from the transistor 100 of the first embodiment in that the lower electrode 16 does not include the third region 16c and the fourth region 16d.

Figure 15:
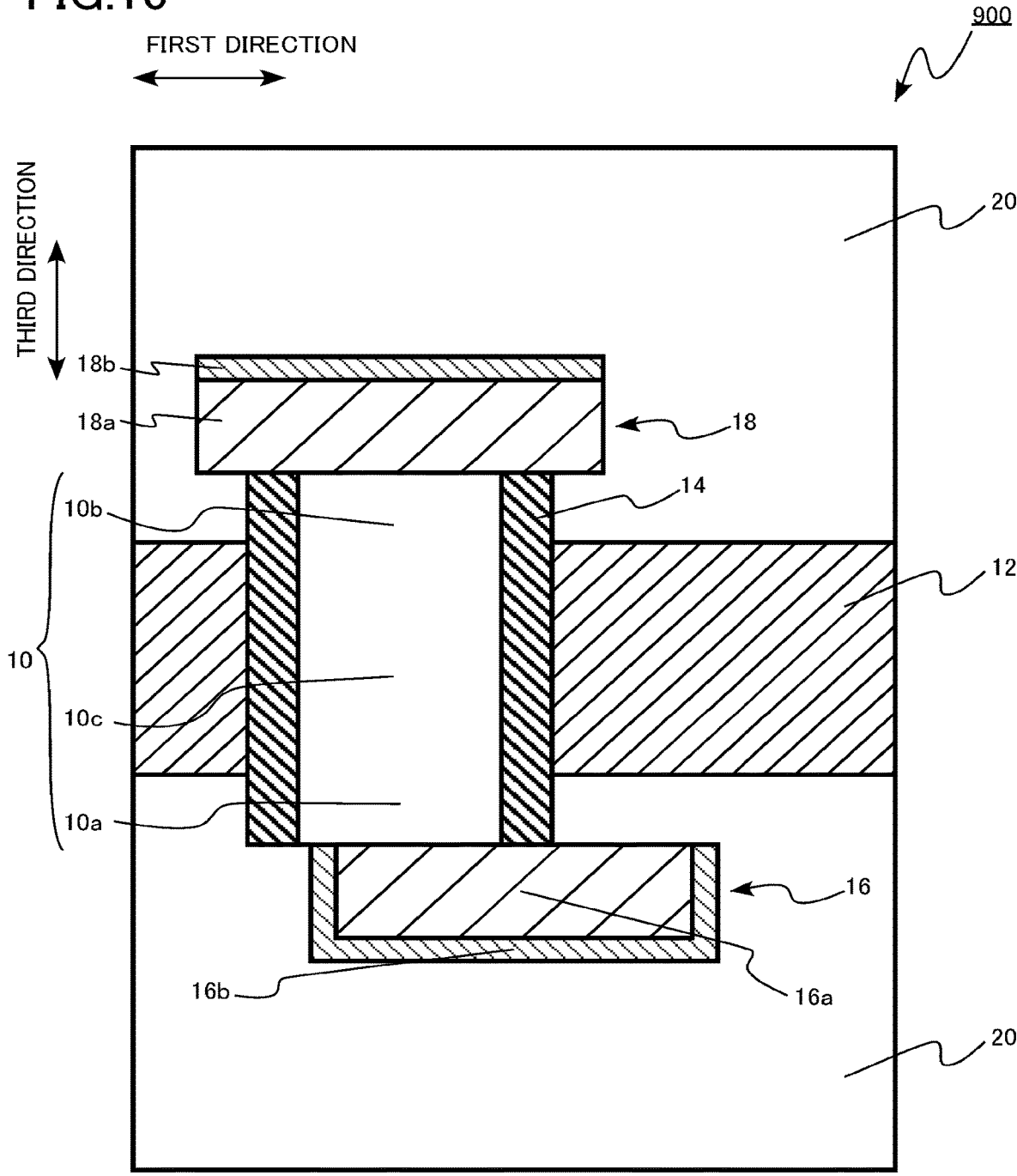
FIG. 15 is an explanatory diagram of a function and an effect of the semiconductor device according to the first embodiment.

FIG. 15 is an explanatory diagram of a function and an effect of the semiconductor device according to the first embodiment.

FIG. 15 illustrates a case where misalignment occurs when manufacturing the transistor 900 of the comparative example. Specifically, a case where misalignment occurs between the opening 38 and the pattern of the lower layer, in a step similar to the step of forming the opening 38 illustrated in FIG. 8 in the method for manufacturing the transistor 100 will be described.

When the oxide semiconductor layer 10 is shifted in the first direction with respect to the lower electrode 16, the oxide semiconductor layer 10 and the second region 16b of the lower electrode 16 are in direct contact with each other.

The second region 16b is formed of, for example, a metal or a metal nitride. At the time of the heat treatment when manufacturing the transistor 900, since oxygen in the oxide semiconductor layer 10 is absorbed by the second region 16b, oxygen in the oxide semiconductor layer 10 is released. Therefore, the oxygen deficiency occurs in the oxide semiconductor layer 10. Accordingly, the threshold voltage of the transistor 900 decreases.

Figure 16:
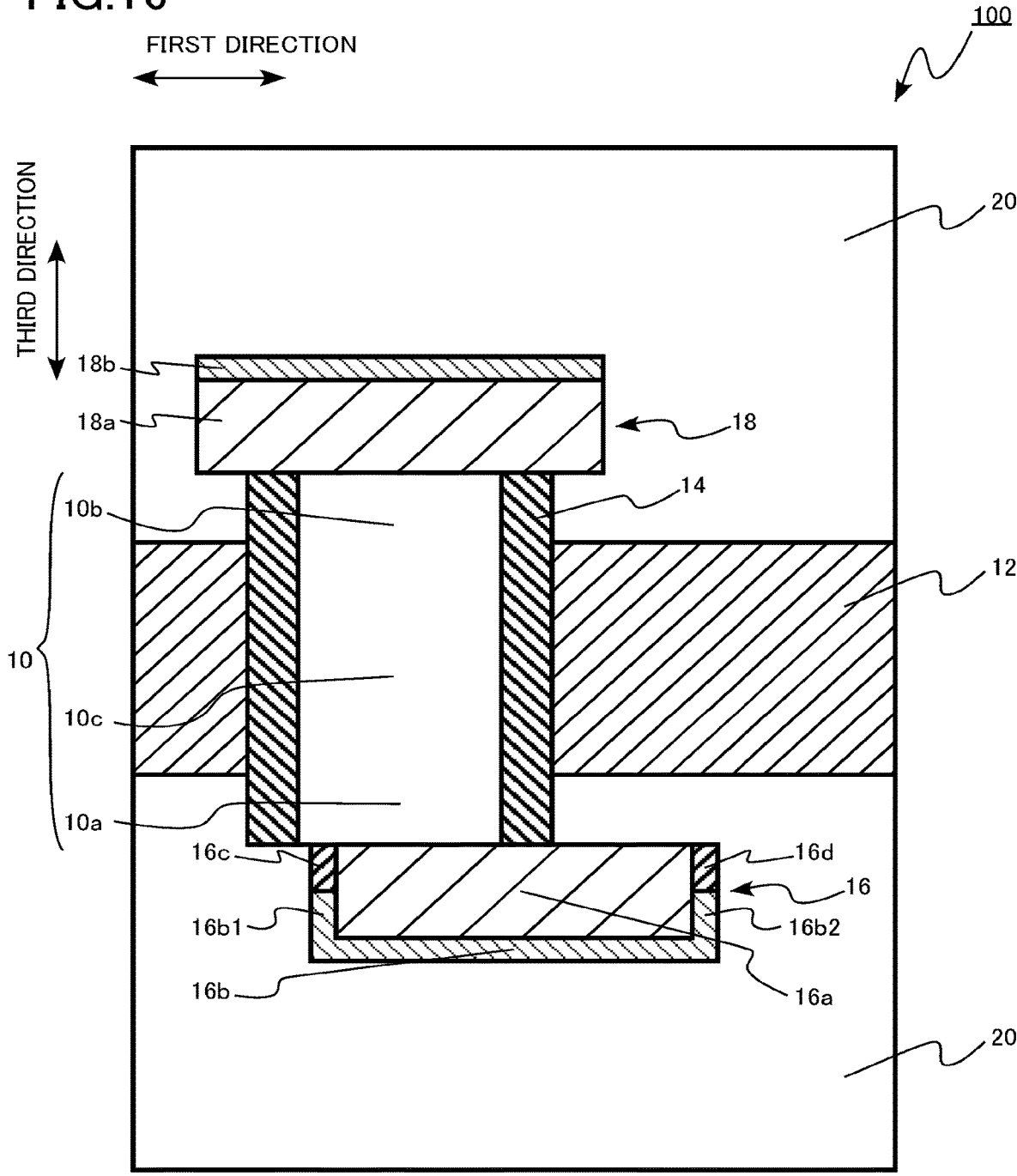
FIG. 16 is an explanatory diagram of a function and an effect of the semiconductor device according to the first embodiment.

FIG. 16 is an explanatory diagram of a function and an effect of the semiconductor device according to the first embodiment.

FIG. 16 illustrates a case where misalignment occurs when manufacturing the transistor 100 of the first embodiment. Specifically, a case where misalignment occurs between the opening 38 and the pattern of the lower layer, in the step of forming the opening 38 illustrated in FIG. 8 in the method for manufacturing the transistor 100 will be described.

When the oxide semiconductor layer 10 is shifted in the first direction with respect to the lower electrode 16, the oxide semiconductor layer 10 and the third region 16c of the lower electrode 16 are in direct contact with each other.

The third region 16c is formed of an oxide. Therefore, at the time of the heat treatment when manufacturing the transistor 100, oxygen in the oxide semiconductor layer 10 is prevented from being absorbed by the third region 16c. Accordingly, the threshold voltage of the transistor 100 is prevented from decreasing. Due to this, heat resistance of the transistor 100 is improved.

When the oxide semiconductor layer 10 is shifted in the first direction with respect to the lower electrode 16, the same effect is obtained even in a case where the oxide semiconductor layer 10 and the fourth region 16d of the lower electrode 16 are in direct contact with each other.

The third region 16c and fourth region 16d of the lower electrode 16 of the transistor 100 have high resistance since the third region 16c and the fourth region 16d are formed of the oxide. For example, the third region 16c and the fourth region 16d are formed of an insulator. Therefore, an electric field concentration at upper end corners of the lower electrode 16 (a portion X surrounded by a dotted line circle in FIG. 1) is alleviated. Accordingly, for example, a leakage current between the lower electrode 16 and the gate electrode 12 is suppressed, and a malfunction of the transistor 100 is suppressed.

From the viewpoint of preventing oxygen from being absorbed by the third region 16c and the fourth region 16d, the atomic concentration of oxygen (O) of the third region 16c and the fourth region 16d is preferably two or more orders of magnitude higher than the atomic concentration of oxygen (O) of the second region 16b, and more preferably three or more orders of magnitude higher than the atomic concentration of oxygen (O) of the second region 16b.

From the viewpoint of preventing oxygen from being absorbed by the third region 16c and the fourth region 16d, the atomic concentration of oxygen (O) of the third region 16c and the fourth region 16d is preferably equal to or more than $1 \times 10^{20}$ atoms/cm$^3$, and more preferably equal to or more than $1 \times 10^{21}$ atoms/cm$^3$.

From the viewpoint of reducing the electric resistance of the lower electrode 16, the thickness of the second region 16b is preferably larger than the thickness of the first region 16a. As described above, the thicknesses of the first region 16a and the second region 16b are the thicknesses in the third direction.

In the transistor 100, a case where the gate electrode 12 is provided to surround the oxide semiconductor layer 10 has been described as an example, but the gate electrode 12 may not completely surround the oxide semiconductor layer 10. For example, the gate electrode 12 may be provided to face a part of the oxide semiconductor layer 10.

As described above, according to the first embodiment, the fluctuation of the threshold voltage after the heat treatment is suppressed, and the oxide semiconductor transistor having high heat resistance is realized.

Second Embodiment

A semiconductor device according to the second embodiment is different from the semiconductor device according to the first embodiment in further including a first conductive layer electrically connected to the first electrode, the first conductive layer having the first electrode provided between the first conductive layer and the oxide semiconductor layer, and in further including a second conductive layer electrically connected to the second electrode, the second conductive layer having the second electrode provided between the second conductive layer and the oxide semiconductor layer. Hereinafter, description of the contents overlapping with the first embodiment may be partially omitted.

Figure 17:
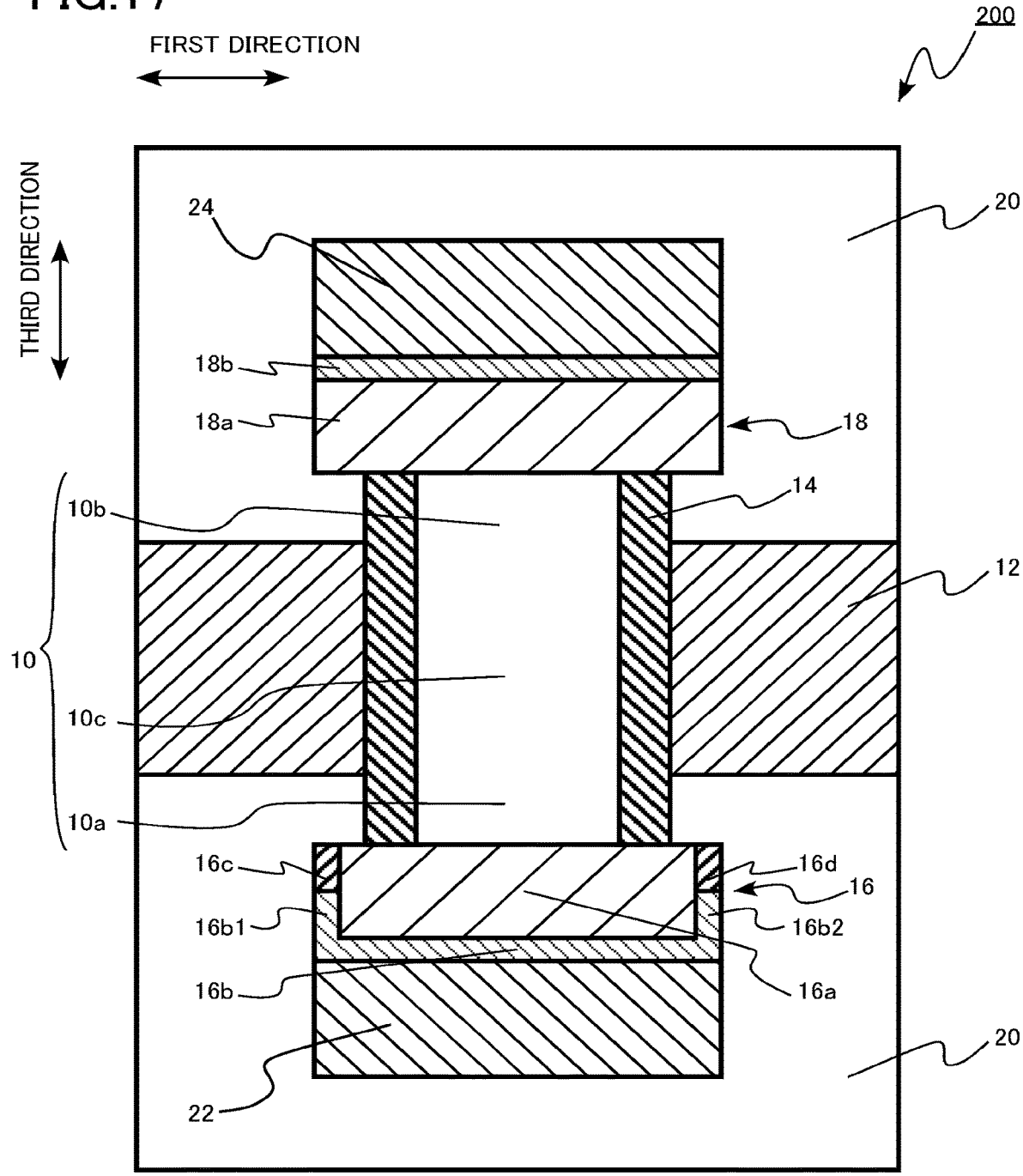
FIG. 17 is a schematic cross-sectional view of a semiconductor device according to a second embodiment.

FIG. 17 is a schematic cross-sectional view of the semiconductor device according to the second embodiment.

The semiconductor device of the second embodiment is a transistor 200. The transistor 200 is an oxide semiconductor transistor in which a channel is formed in an oxide semiconductor. The transistor 200 is a so-called SGT in which a gate electrode is provided to surround an oxide semiconductor layer in which a channel is formed. The transistor 200 is a so-called vertical transistor.

The transistor 200 includes the oxide semiconductor layer 10, the gate electrode 12, the gate insulating layer 14, the lower electrode 16, the upper electrode 18, the interlayer insulating layer 20, a lower conductive layer 22, and an upper conductive layer 24. The lower electrode 16 is an example of a first electrode. The upper electrode 18 is an example of a second electrode. The lower conductive layer 22 is an example of the first conductive layer. The upper conductive layer 24 is an example of the second conductive layer.

The lower electrode 16 includes a first region 16a, a second region 16b, a third region 16c, and a fourth region 16d. The upper electrode 18 includes a fifth region 18a and a sixth region 18b.

The lower conductive layer 22 is provided on a lower side of the lower electrode 16. The lower conductive layer 22 is disposed in the third direction of the lower electrode 16. The lower electrode 16 is provided between the lower conductive layer 22 and the oxide semiconductor layer 10. The lower conductive layer 22 is electrically connected to the lower electrode 16.

The lower conductive layer 22 is a conductor. The lower conductive layer 22 is formed of, for example, a metal or a semiconductor. The lower conductive layer 22 is formed of, for example, tungsten or polycrystalline silicon.

The upper conductive layer 24 is provided on an upper side of the upper electrode 18. The upper conductive layer 24 is disposed in the third direction of the upper electrode 18. The upper electrode 18 is provided between the upper conductive layer 24 and the oxide semiconductor layer 10. The upper conductive layer 24 is electrically connected to the upper electrode 18.

The upper conductive layer 24 is a conductor. The upper conductive layer 24 is formed of, for example, a metal or a semiconductor. The upper conductive layer 24 is formed of, for example, tungsten or polycrystalline silicon.

The lower electrode 16 includes a second region 16b between the lower conductive layer 22 and a first region 16a. When the transistor 200 is manufactured, as in the case of the transistor 100, the first conductive film 32 serving as the second region 16b is formed before the first metal oxide film 33 serving as the first region 16a of the lower electrode 16 is formed. Therefore, oxidation of the lower conductive layer 22 is suppressed. By suppressing the oxidation of the lower conductive layer 22, an oxide film having high resistance is prevented from being formed between the lower conductive layer 22 and the lower electrode 16.

As described above, according to the second embodiment, as in the first embodiment, the fluctuation of the threshold voltage after the heat treatment is suppressed, and the oxide semiconductor transistor having high heat resistance is realized.

Third Embodiment

A semiconductor memory device according to a third embodiment includes: a first wiring extending in a first direction; a second wiring extending in a second direction intersecting with the first direction; and a memory cell, in which the memory cell includes an oxide semiconductor layer including a first portion, a second portion, and a third portion between the first portion and the second portion, a gate electrode being electrically connected to the second wiring, a gate insulating layer provided between the third portion and the gate electrode, a first electrode electrically connected to the first portion, the first electrode including a first region, a second region, a third region, and a fourth region, the first region being disposed between the first portion and the second region, the first region being disposed between the third region and the fourth region, the third region being disposed on the oxide semiconductor layer side of the second region, the fourth region being disposed on the oxide semiconductor layer side of the second region, the first region containing at least one element selected from the group consisting of indium (In), zinc (Zn), tin (Sn) and cadmium (Cd), and oxygen (O), the second region containing at least one metal element selected from the group consisting of titanium (Ti), tantalum (Ta), tungsten (W), and ruthenium (Ru), the third region containing the at least one metal element and oxygen (O), the fourth region containing the at least one metal element and oxygen (O), the third region having an atomic concentration of oxygen (O) higher than an atomic concentration of oxygen (O) of the second region, and the fourth region having an atomic concentration of oxygen (O) higher than the atomic concentration of oxygen (O) of the second region, a second electrode electrically connected to the second portion, the second electrode having the oxide semiconductor layer provided between the second electrode and the first electrode, and a capacitor connected to one of the first electrode and the second electrode, and the first wiring is electrically connected to the other of the first electrode or the second electrode. Hereinafter, description of the contents overlapping with the first embodiment or the second embodiment may be partially omitted.

The semiconductor memory device of the third embodiment is a semiconductor memory 300. The semiconductor memory device of the third embodiment is a dynamic random access memory (DRAM). The semiconductor memory 300 uses the transistor 100 of the first embodiment as a switching transistor of a memory cell of the DRAM.

Figure 18:
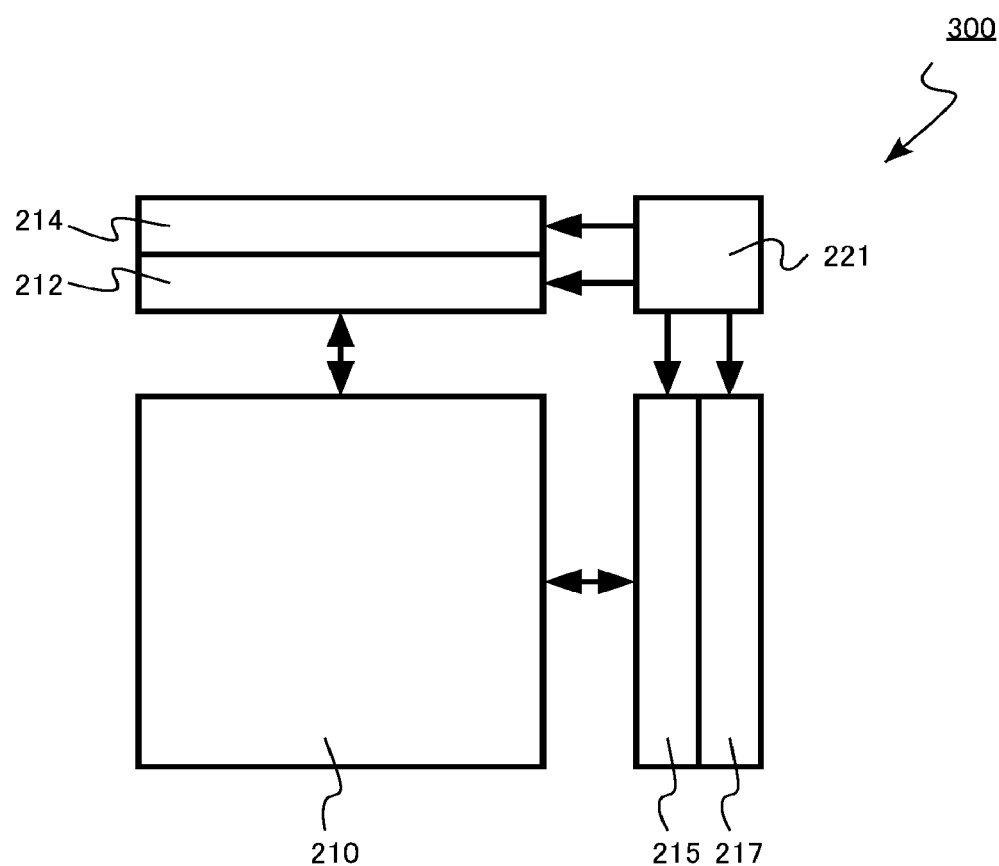
FIG. 18 is a block diagram of a semiconductor memory device according to a third embodiment.

FIG. 18 is a block diagram of the semiconductor memory device according to the third embodiment.

As illustrated in FIG. 18, the semiconductor memory 300 includes a memory cell array 210, a word line driver circuit 212, a row decoder circuit 214, a sense amplifier circuit 215, a column decoder circuit 217, and a control circuit 221.

Figure 19:
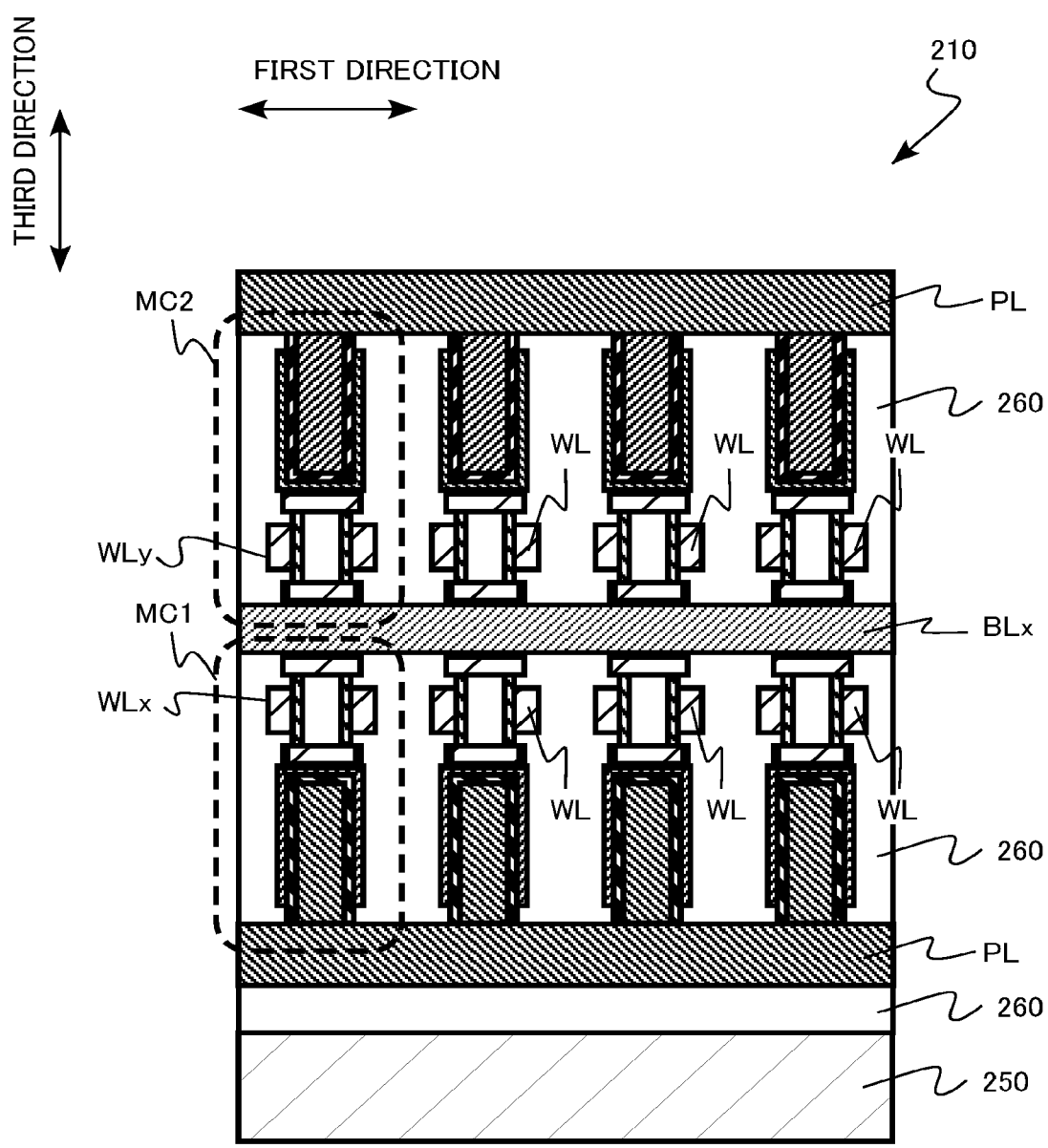
FIG. 19 is a schematic cross-sectional view of a memory cell array of the semiconductor memory device according to the third embodiment.
Figure 20:
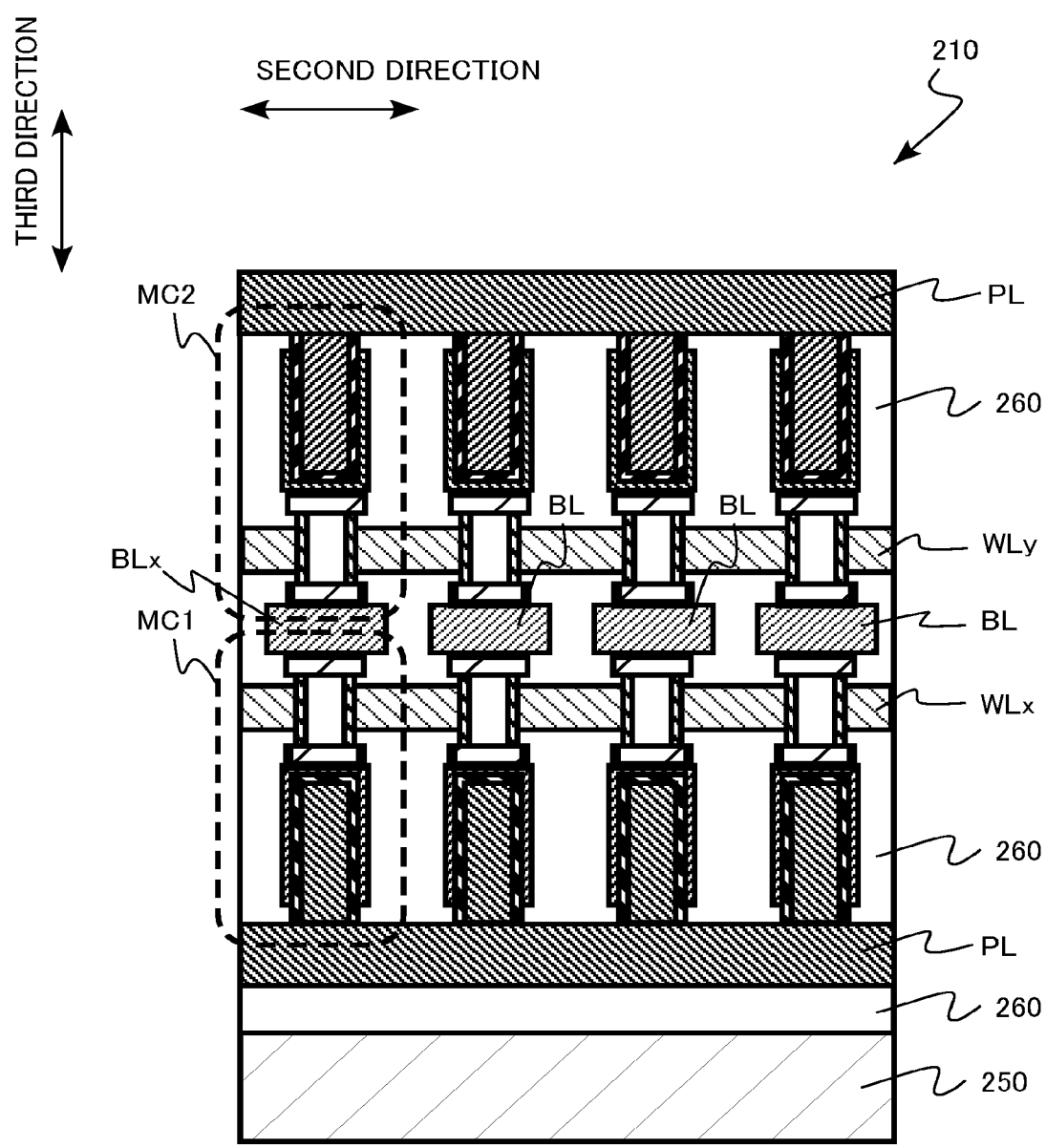
FIG. 20 is a schematic cross-sectional view of a memory cell array of the semiconductor memory device according to the third embodiment.

FIGS. 19 and 20 are schematic cross-sectional views of the memory cell array of the semiconductor memory device according to a third embodiment. FIG. 19 is a cross-sectional view of a plane including the first direction and the third direction, and FIG. 20 is a cross-sectional view of a plane including the second direction and the third direction. The first direction and the second direction intersect with each other. For example, the first direction and the second direction are perpendicular to each other. The third direction is a direction perpendicular to the first direction and the second direction. For example, the third direction is a direction perpendicular to a substrate.

The memory cell array 210 of the third embodiment has a three-dimensional structure in which the memory cells are three-dimensionally disposed. In FIGS. 19 and 20, each region surrounded by a broken line represents one memory cell.

The memory cell array 210 includes a silicon substrate 250.

The memory cell array 210 includes, for example, a plurality of bit lines BL and a plurality of word lines WL on the silicon substrate 250. Each of the bit lines BL extends in the first direction. Each of the word lines WL extends in the second direction.

For example, the bit line BL and the word line WL vertically intersect with each other. The memory cell is disposed in a region in which the bit line BL and the word line WL intersect with each other. The memory cell includes a first memory cell MC1 and a second memory cell MC2. The first memory cell MC1 and the second memory cell MC2 are examples of the memory cell.

The bit line BL connected to the first memory cell MC1 and the second memory cell MC2 is a bit line BLx. The bit line BLx is an example of the first wiring.

The word line WL connected to the first memory cell MC1 is a word line WLx. The word line WLx is an example of the second wiring. The word line WL connected to the second memory cell MC2 is a word line WLy. The word line WLx is provided on one side of the bit line BLx. The word line WLy is provided on the other side of the bit line BLx.

The memory cell array 210 includes a plurality of plate electrode lines PL. Each of the plate electrode lines PL is connected to the plate electrode 72 of each of the memory cells.

The memory cell array 210 includes an interlayer insulating layer 260 for electrically separating each of the wirings and each of the electrodes.

A plurality of the word lines WL are electrically connected to the row decoder circuit 214. A plurality of the bit lines BL are electrically connected to the sense amplifier circuit 215.

The row decoder circuit 214 has a function of selecting the word line WL according to an input row address signal. The word line driver circuit 212 has a function of applying a predetermined voltage to the word line WL selected by the row decoder circuit 214.

The column decoder circuit 217 has a function of selecting the bit line BL according to an input column address signal. The sense amplifier circuit 215 has a function of applying a predetermined voltage to the bit line BL selected by the column decoder circuit 217. The sense amplifier circuit 215 has a function of detecting and amplifying an electric potential of the bit line BL.

The control circuit 221 has a function of controlling the word line driver circuit 212, the row decoder circuit 214, the sense amplifier circuit 215, the column decoder circuit 217, and other circuits (not illustrated).

Circuits such as the word line driver circuit 212, the row decoder circuit 214, the sense amplifier circuit 215, the column decoder circuit 217, and the control circuit 221 include, for example, transistors and wiring layers (not illustrated). The transistor is formed by using, for example, the silicon substrate 250.

The bit line BL and the word line WL are a conductor. The bit line BL and the word line WL are formed of, for example, a metal.

Figure 21:
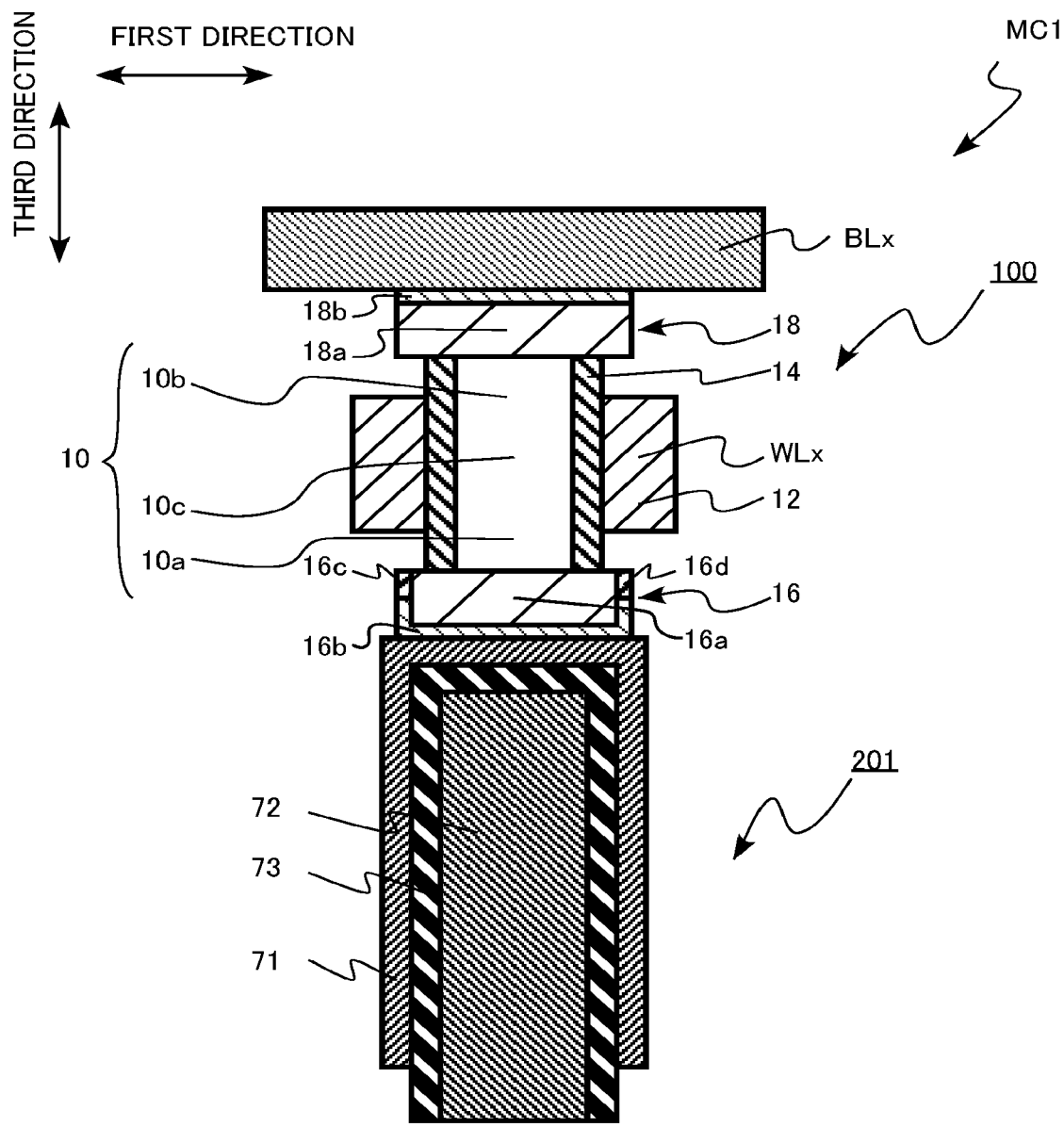
FIG. 21 is a schematic cross-sectional view of a first memory cell of the semiconductor memory device according to the third embodiment.
Figure 22:
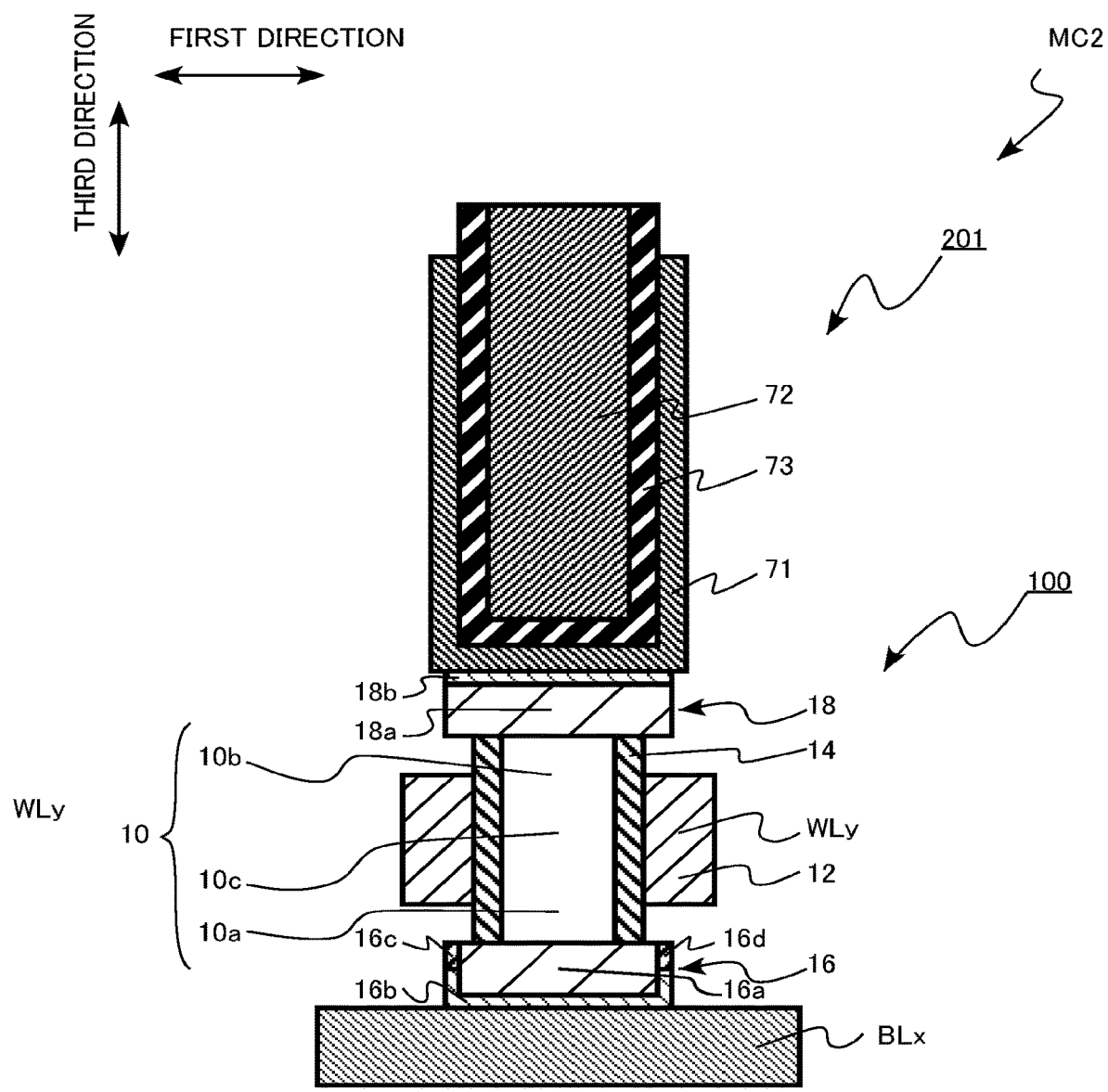
FIG. 22 is a schematic cross-sectional view of a second memory cell of the semiconductor memory device according to the third embodiment.

FIG. 21 is a schematic cross-sectional view of the first memory cell of the semiconductor memory device according to the third embodiment. FIG. 22 is a schematic cross-sectional view of the second memory cell of the semiconductor memory device according to the third embodiment.

The first memory cell MC1 is provided between the silicon substrate 250 and the bit line BLx. The bit line BLx is provided between the silicon substrate 250 and the second memory cell MC2.

The first memory cell MC1 is provided on a lower side of the bit line BLx. The second memory cell MC2 is provided on an upper side of the bit line BLx.

The first memory cell MC1 is provided on one side of the bit line BLx. The second memory cell MC2 is provided on the other side of the bit line BLx.

Each of the first memory cell MC1 and the second memory cell MC2 includes a transistor 100 and a capacitor 201.

The transistor 100 includes an oxide semiconductor layer 10, a gate electrode 12, a gate insulating layer 14, a lower electrode 16, an upper electrode 18, and an interlayer insulating layer 20. The lower electrode 16 is an example of a first electrode. The upper electrode 18 is an example of a second electrode.

The oxide semiconductor layer 10 includes a first portion 10a, a second portion 10b, and a third portion 10c. The third portion 10c is a region between the first portion 10a and the second portion 10b.

The lower electrode 16 includes a first region 16a, a second region 16b, a third region 16c, and a fourth region 16d. The upper electrode 18 includes a fifth region 18a and a sixth region 18b.

The word line WLx is electrically connected to the gate electrode 12 of the first memory cell MC1. The word line WLy is electrically connected to the gate electrode 12 of the second memory cell MC2.

The capacitor 201 includes a cell electrode 71, a plate electrode 72, and a capacitor insulating film 73. The cell electrode 71 and the plate electrode 72 are formed of, for example, titanium nitride. The capacitor insulating film 73 has, for example, a stacked structure of zirconium oxide, aluminum oxide, and zirconium oxide.

In the first memory cell MC1, the capacitor 201 is electrically connected to the lower electrode 16. The cell electrode 71 of the capacitor 201 is connected to the lower electrode 16. The plate electrode 72 is connected to the plate electrode line PL. In the first memory cell MC1, the bit line BLx is electrically connected to the upper electrode 18.

In the second memory cell MC2, the capacitor 201 is electrically connected to the upper electrode 18. The cell electrode 71 of the capacitor 201 is connected to the upper electrode 18. The plate electrode 72 is connected to the plate electrode line PL. In the second memory cell MC2, the bit line BLx is electrically connected to the lower electrode 16.

FIGS. 19, 20, 21, and 22 illustrate, as an example, a case where the word line WL and the gate electrode 12 are simultaneously formed of the same material. The word line WL and the gate electrode 12 may be separately formed of different materials.

FIGS. 19, 20, 21, and 22 illustrate, as an example, a case where the bit line BL and lower electrode 16, and the bit line BL and upper electrode 18 are separately formed of different materials. The bit line BL and lower electrode 16, and the bit line BL and upper electrode 18 may be simultaneously formed of the same material.

According to the third embodiment, by using the transistor 100 of the first embodiment as a switching transistor of the DRAM, the fluctuation of the threshold voltage after the heat treatment is suppressed, and a semiconductor memory having high heat resistance is realized.

In the first to third embodiments, a case where the oxide semiconductor layer 10 is formed of a metal oxide containing indium (In), gallium (Ga), and zinc (Zn) has been described as an example, and other metal oxides may be applied to the oxide semiconductor layer 10.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a gate electrode extending in a first direction or a second direction;
    an oxide semiconductor layer including a first portion, a second portion, and a third portion provided between the first portion and the second portion in a third direction intersecting with the gate electrode;
    a gate insulating layer provided at least between the third portion and the gate electrode;
    a first electrode electrically connected to the first portion, the first electrode including a first region, a second region, a third region, and a fourth region, the first region being disposed between the first portion and the second region in the third direction, the first region being disposed between the third region and the fourth region in the first direction, the third region being disposed on an oxide semiconductor layer side of the second region, the fourth region being disposed on the oxide semiconductor layer side of the second region, the first region containing at least one element selected from the group consisting of indium (In), zinc (Zn), tin (Sn) and cadmium (Cd), and oxygen (O), the second region containing at least one metal element selected from the group consisting of titanium (Ti), tantalum (Ta), tungsten (W), and ruthenium (Ru), the third region containing the at least one metal element and oxygen (O), the fourth region containing the at least one metal element and oxygen (O), the third region having an atomic concentration of oxygen (O) higher than an atomic concentration of oxygen (O) of the second region, and the fourth region having an atomic concentration of oxygen (O) higher than the atomic concentration of oxygen (O) of the second region; and
    a second electrode electrically connected to the second portion, the oxide semiconductor layer provided between the second electrode and the first electrode.

2. The semiconductor device according to claim 1, wherein the first region is disposed between one part of the second region and another part of the second region in the first direction.

3. The semiconductor device according to claim 1, wherein a thickness of the second region is smaller than a thickness of the first region.

4. The semiconductor device according to claim 1, wherein electric resistance of the third region is higher than electric resistance of the second region, and electric resistance of the fourth region is higher than the electric resistance of the second region.

5. The semiconductor device according to claim 1, wherein the atomic concentration of oxygen (O) of the third region is two or more orders of magnitude higher than the atomic concentration of oxygen (O) of the second region, and the atomic concentration of oxygen (O) of the fourth region is two or more orders of magnitude higher than the atomic concentration of oxygen (O) of the second region.

6. The semiconductor device according to claim 1, wherein the atomic concentration of oxygen (O) of the third region is equal to or more than $1 \times 10^{20}$ atoms/cm$^3$, and the atomic concentration of oxygen (O) of the fourth region is equal to or more than $1 \times 10^{20}$ atoms/cm$^3$.

7. The semiconductor device according to claim 1, wherein the second region, the third region, and the fourth region further contain nitrogen (N).

8. The semiconductor device according to claim 1, further comprising:
    a first conductive layer electrically connected to the first electrode, the first electrode provided between the first conductive layer and the oxide semiconductor layer in the third direction.

9. The semiconductor device according to claim 1, wherein the second electrode includes a fifth region and a sixth region, the fifth region is disposed between the second portion and the sixth region, the fifth region contains at least one element selected from the group consisting of indium (In), zinc (Zn), tin (Sn) and cadmium (Cd), and oxygen (O), the sixth region contains the at least one metal element, an atomic concentration of oxygen (O) of the sixth region is lower than the atomic concentration of oxygen (O) of the third region, and the atomic concentration of oxygen (O) of the sixth region is lower than the atomic concentration of oxygen (O) of the fourth region.

10. The semiconductor device according to claim 1, further comprising:
a second conductive layer electrically connected to the second electrode, the second electrode provided between the second conductive layer and the oxide semiconductor layer in the third direction.

11. The semiconductor device according to claim 1, wherein the oxide semiconductor layer is in contact with the third region or the fourth region.

12. The semiconductor device according to claim 1, wherein the oxide semiconductor layer contains indium (In), gallium (Ga), and zinc (Zn).

13. The semiconductor device according to claim 1, wherein the gate electrode surrounds the oxide semiconductor layer.

14. A semiconductor memory device comprising:
a first wiring extending in a first direction;
a second wiring extending in a second direction intersecting with the first direction; and
a memory cell,
wherein the memory cell includes
an oxide semiconductor layer including a first portion, a second portion, and a third portion provided between the first portion and the second portion,
a gate electrode being electrically connected to the second wiring,
a gate insulating layer provided at least between the third portion and the gate electrode,
a first electrode electrically connected to the first portion, the first electrode including a first region, a second region, a third region, and a fourth region, the first region being disposed between the first portion and the second region in the third direction, the first region being disposed between the third region and the fourth region in the first direction, the third region being disposed on an oxide semiconductor layer side of the second region, the fourth region being disposed on the oxide semiconductor layer side of the second region, the first region containing at least one element selected from the group consisting of indium (In), zinc (Zn), tin (Sn) and cadmium (Cd), and oxygen (O), the second region containing at least one metal element selected from the group consisting of titanium (Ti), tantalum (Ta), tungsten (W), and ruthenium (Ru), the third region containing the at least one metal element and oxygen (O), the fourth region containing the at least one metal element and oxygen (O), the third region having an atomic concentration of oxygen (O) higher than an atomic concentration of oxygen (O) of the second region, and the fourth region having an atomic concentration of oxygen (O) higher than the atomic concentration of oxygen (O) of the second region,
a second electrode electrically connected to the second portion, the oxide semiconductor layer provided between the second electrode and the first electrode, and
a capacitor connected to one of the first electrode or the second electrode, and
the first wiring is electrically connected to another of the first electrode or the second electrode.

15. The semiconductor memory device according to claim 14, wherein the first region is disposed between one part of the second region and another part of the second region in the first region.

16. The semiconductor memory device according to claim 14, wherein a thickness of the second region is smaller than a thickness of the first region.

17. The semiconductor memory device according to claim 14, wherein electric resistance of the third region is higher than electric resistance of the second region, and electric resistance of the fourth region is higher than the electric resistance of the second region.

18. The semiconductor memory device according to claim 14, wherein the atomic concentration of oxygen (O) of the third region is two or more orders of magnitude higher than the atomic concentration of oxygen (O) of the second region, and the atomic concentration of oxygen (O) of the fourth region is two or more orders of magnitude higher than the atomic concentration of oxygen (O) of the second region.

19. The semiconductor memory device according to claim 14, wherein the atomic concentration of oxygen (O) of the third region is equal to or more than $1 \times 10^{20}$ atoms/cm$^3$, and the atomic concentration of oxygen (O) of the fourth region is equal to or more than $1 \times 10^{20}$ atoms/cm$^3$.

20. The semiconductor memory device according to claim 14, wherein the second region, the third region, and the fourth region further contain nitrogen (N).

* * * * *